United States Patent
Wu et al.

(10) Patent No.: US 12,411,566 B2
(45) Date of Patent: Sep. 9, 2025

(54) METHOD FOR MANUFACTURING DISPLAY DEVICE

(71) Applicant: Innolux Corporation, Miao-Li County (TW)

(72) Inventors: Yuan-Lin Wu, Miao-Li County (TW); Chandra Lius, Miao-Li County (TW); Tsung-Han Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 468 days.

(21) Appl. No.: 17/672,720

(22) Filed: Feb. 16, 2022

(65) Prior Publication Data

US 2022/0293688 A1 Sep. 15, 2022

(30) Foreign Application Priority Data

Mar. 9, 2021 (CN) .......................... 202110255593.6

(51) Int. Cl.
| | |
|---|---|
| *G06F 3/041* | (2006.01) |
| *H10K 50/86* | (2023.01) |
| *H10K 59/12* | (2023.01) |
| *H10K 59/124* | (2023.01) |
| *H10K 59/40* | (2023.01) |
| *H10K 59/80* | (2023.01) |
| *H10K 71/00* | (2023.01) |

(52) U.S. Cl.
CPC ........... *G06F 3/0412* (2013.01); *H10K 50/86* (2023.02); *H10K 59/124* (2023.02); *H10K 59/40* (2023.02); *H10K 59/8791* (2023.02); *H10K 71/00* (2023.02); *H10K 59/12* (2023.02)

(58) Field of Classification Search
CPC ...... H10K 59/40; H10K 71/00; H10K 59/124; H10K 50/86; H10K 59/12; H10K 59/8791; G06F 3/0412
See application file for complete search history.

(56) References Cited

U.S. PATENT DOCUMENTS

| | | | |
|---|---|---|---|
| 2018/0182816 A1 | 6/2018 | Kang et al. | |
| 2021/0066625 A1* | 3/2021 | Tian | ...................... H10K 77/111 |
| 2021/0208731 A1* | 7/2021 | Hu | ...................... G02F 1/13338 |
| 2021/0343813 A1* | 11/2021 | Lee | ...................... H10K 59/8731 |
| 2023/0060493 A1* | 3/2023 | Wu | ...................... H10K 59/40 |

OTHER PUBLICATIONS

"Search Report of Europe Counterpart Application", issued on Jul. 21, 2022, p. 1-p. 8.

* cited by examiner

*Primary Examiner* — Richard A Booth
(74) *Attorney, Agent, or Firm* — JCIPRNET

(57) ABSTRACT

The disclosure provides a method for manufacturing a display device, including the following steps. A substrate is provided. A pixel circuit is formed on the substrate. A light-emitting unit is formed on the pixel circuit. A touch sensing unit is formed on the light-emitting unit. An insulating layer is formed on the touch sensing unit. An anti-reflection layer is formed on the insulating layer. The method for manufacturing the display device of the embodiment of the disclosure can improve reliability.

7 Claims, 28 Drawing Sheets

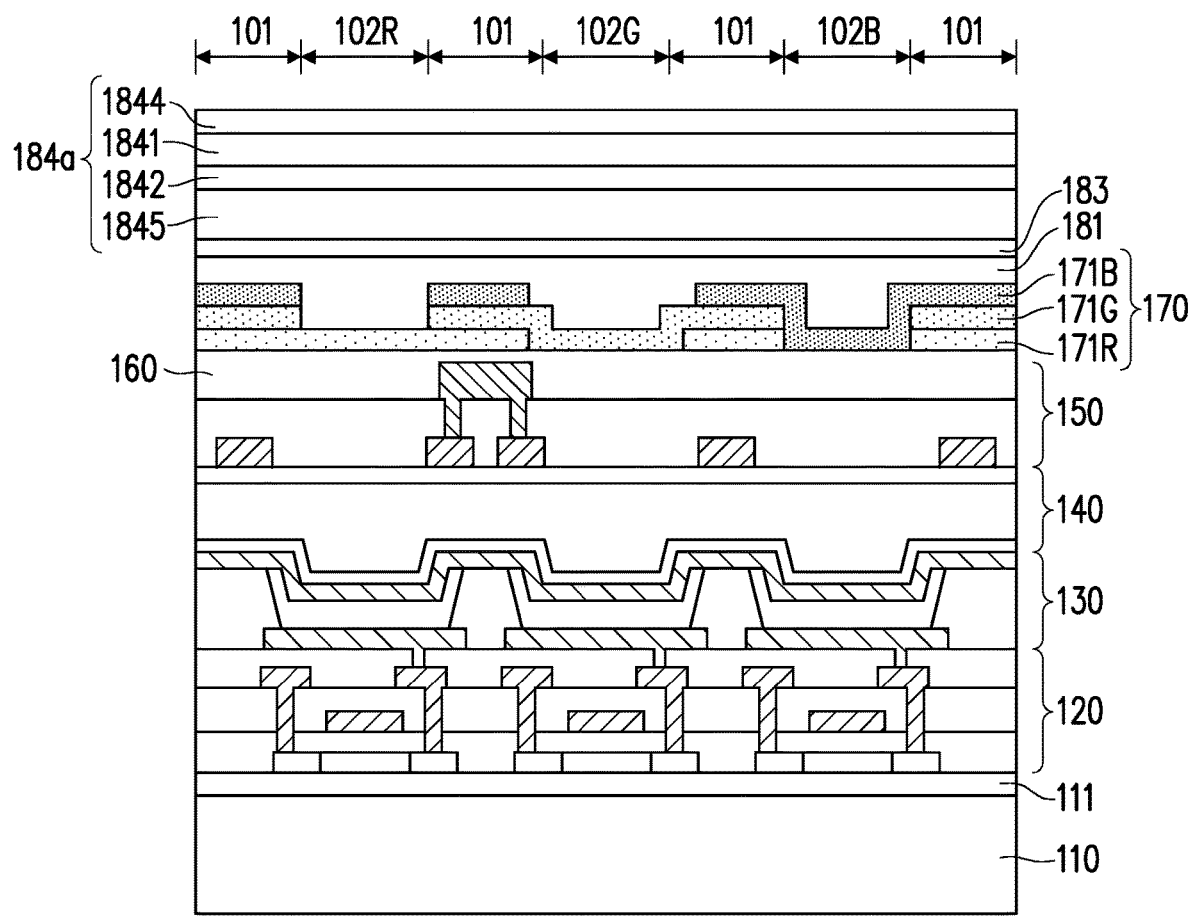
FIG. 3H"

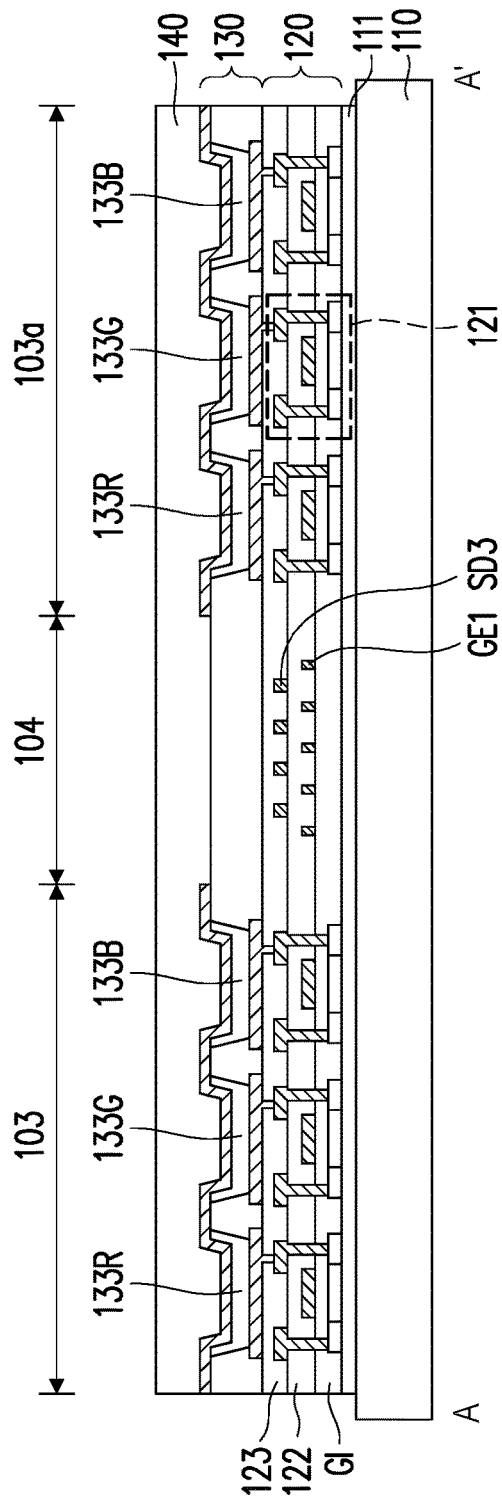
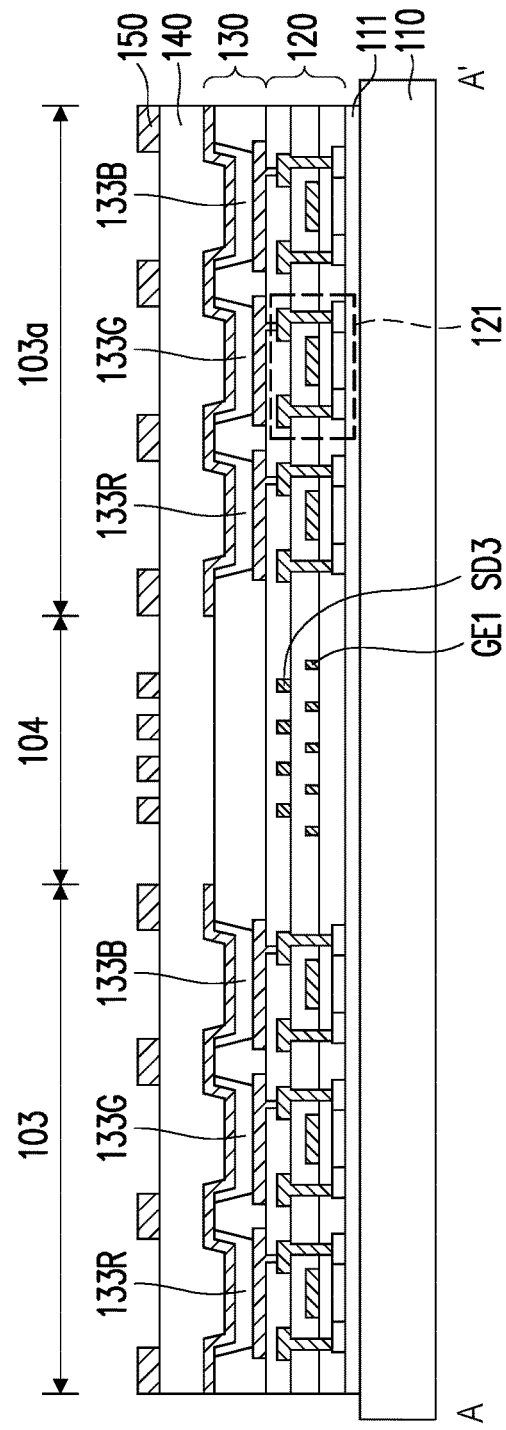
FIG. 10A
FIG. 10B

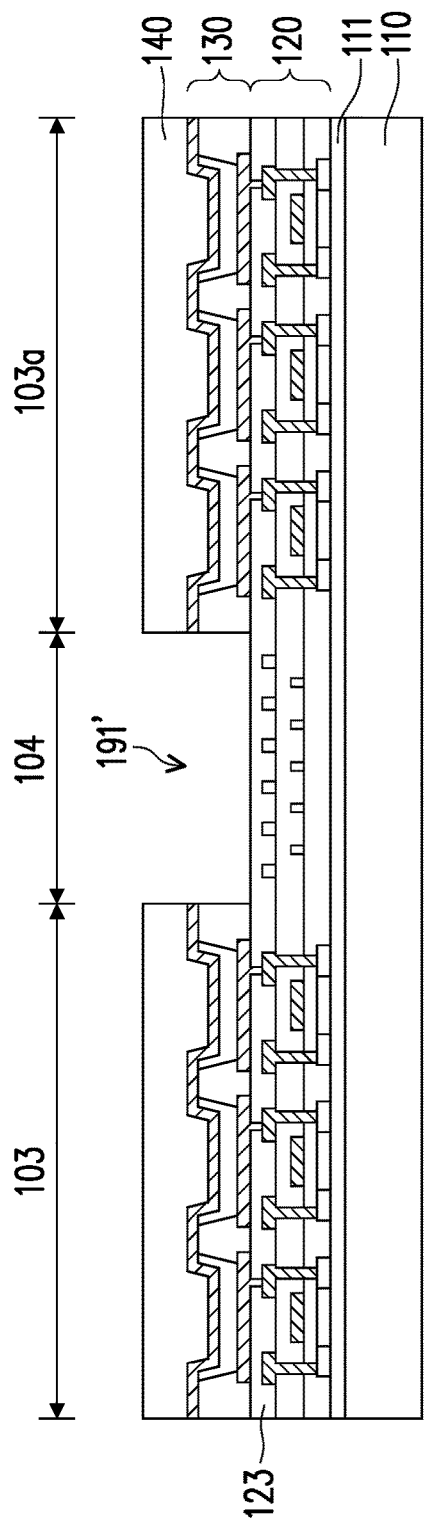
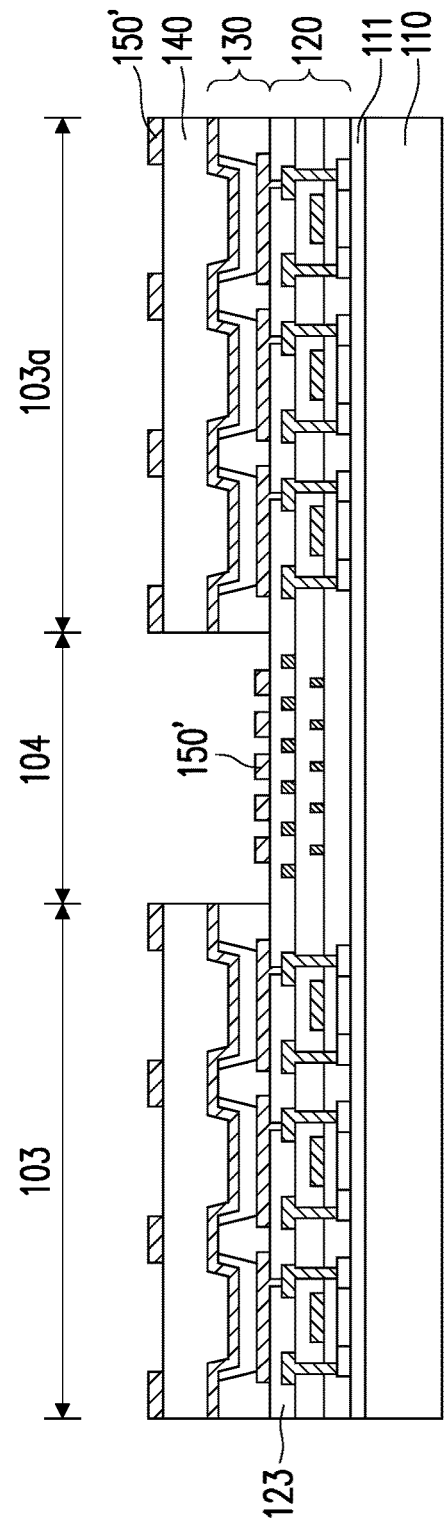
FIG. 12A
FIG. 12B

METHOD FOR MANUFACTURING DISPLAY DEVICE

CROSS-REFERENCE TO RELATED APPLICATION

This application claims the priority benefit of China application serial no. 202110255593.6, filed on Mar. 9, 2021. The entirety of the above-mentioned patent application is hereby incorporated by reference herein and made a part of this specification.

BACKGROUND

Technical Field

The disclosure relates to a method for manufacturing a display device, and more particularly, to a method for manufacturing a display device which can improve reliability.

Description of Related Art

Display devices have been widely applied to electronic devices such as mobile phones, televisions, monitors, tablet computers, car displays, wearable devices, and desktop computers. With the vigorous development of electronic products, the requirements for the display quality of the display devices also increase, such that the display devices are constantly improving towards display effects of high brightness, low energy consumption, high resolution, or high saturation. Meanwhile, the method for manufacturing the display device is constantly improving towards reduced process time, reduced process steps, or an improved process sequence.

SUMMARY

The disclosure provides a method for manufacturing a display device which can improve the reliability of a display device such as improving the bending endurance of the display device, improving the service life of the display device, or improving both of the above, but the disclosure is not limited thereto.

The disclosure provides a method for manufacturing a display device, including the following steps. A substrate is provided. A pixel circuit is formed on the substrate. A light-emitting unit is formed on the pixel circuit. A touch sensing unit is formed on the light-emitting unit. An insulating layer is formed on the touch sensing unit. An anti-reflection layer is formed on the insulating layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3H' and FIG. 3H" are partial cross-sectional views of a display device according to some embodiments of the disclosure.

FIG. 10A to FIG. 10E are cross-sectional views showing a process of a method for manufacturing the display device of FIG. 9 taken along section line A-A'.

FIG. 12A to FIG. 12C are cross-sectional views showing a process of a method for manufacturing the display device of FIG. 9 taken along section line A-A' according to another embodiment.

DESCRIPTION OF THE EMBODIMENTS

Figure 1:
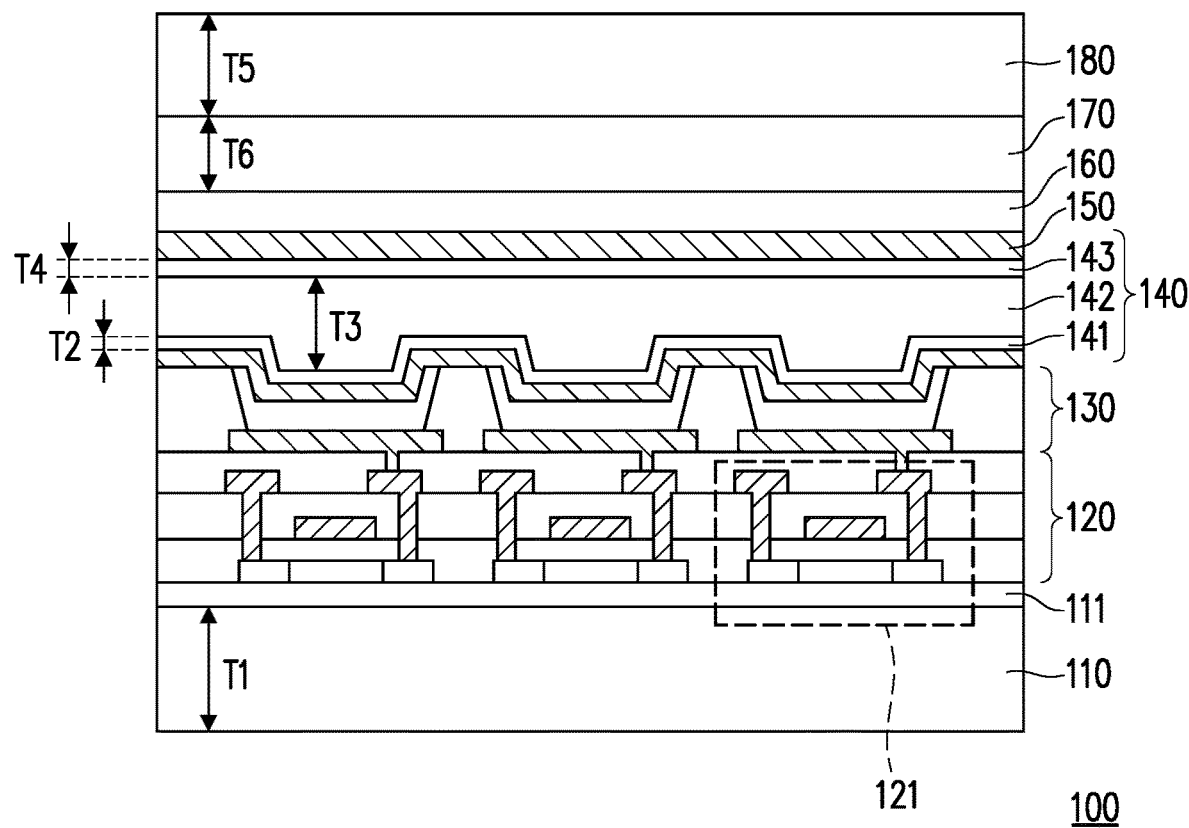
FIG. 1 is a schematic partial cross-sectional view of a display device according to some embodiments of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

In the following specification and claims, the terms "having", "including", "comprising" etc. are open-ended terms, so they should be interpreted to mean "including but not limited to . . . ".

It should be understood that when a component or a film layer is described as being "on" or "connected to" another component or film layer, it may be directly on or connected to the another component or film layer, or there is an intervening component or film layer therebetween (i.e., being indirectly on or indirectly connected). Conversely, when a component or film layer is described as being "directly on" or "directly connected to" another component or film layer, there is no intervening component or film layer therebetween.

The terms such as "first", "second", "third", etc. may be used to describe components, but the components should not be limited by these terms. The terms are only intended to distinguish a component from another component in the specification. It is possible that the claims do not use the same terms and replace the terms with "first", "second", "third" etc. according to the sequence declared in the claims. Accordingly, in the specification, a first component may be described as a second component in the claims.

In some embodiments of the disclosure, unless specifically defined, terms related to bonding and connection such as "connect", "interconnect", etc. may mean that two structures are in direct contact, or that two structures are not in direct contact and another structure is provided therebetween. The terms related to bonding and connection may also cover cases where two structures are both movable or two structures are both fixed. In addition, the term "couple" includes any direct and indirect electrical connection means.

In the disclosure, a length, width, thickness, height, or area, or a distance or spacing between components may be measured by optical microscopy (OM), a scanning electron microscope (SEM), a film thickness profile measuring instrument (α-step), an ellipsometer, or other suitable methods. Specifically, according to some embodiments, a cross-sectional structure image containing components to be measured may be obtained by a scanning electron microscope to measure the width, thickness, height, or area of each component, or the distance or spacing between the components, but the disclosure is not limited thereto. In addition, there may be a certain error between any two values or directions used for comparison.

In the disclosure, the terms such as "approximately", "about", or "substantially" are generally interpreted as one value being within a range of plus or minus 10%, plus or minus 5%, plus or minus 3%, plus or minus 2%, plus or minus 1%, or plus or minus 0.5% of a given value. Herein, a given value refers to an approximate value, i.e., in the absence of a specific expression of "approximately", "about", or "substantially", the meaning of "approximately", "about", or "substantially" may still be implied. In addition, the expression "a given range is between a first numerical value and a second numerical value" means that the given range includes the first numerical value, the second numerical value, and other values therebetween.

The electronic device of the disclosure may include a display device, an antenna device (e.g., a liquid crystal antenna), a sensing device, a light-emitting device, a touch device, or a splicing device, but is not limited thereto. The electronic device may include a bendable or flexible electronic device. The shape of the electronic device may be rectangular, circular, polygonal, a shape with curved edges, or other suitable shapes. The display device may include, for example, a light-emitting diode (LED), a liquid crystal, a fluorescence, a phosphor, a quantum dot (QD), other suitable materials, or a combination of the above, but is not limited thereto. The light-emitting diode may include, for example, an organic light-emitting diode (OLED), an inorganic light-emitting diode, a mini LED, a micro LED, a quantum dot LED (QLED or QDLED), other suitable materials, or any combination of the above, but is not limited thereto. The display device may include, for example, a splicing display device but is not limited thereto. The antenna device may include, for example, a liquid crystal antenna but is not limited thereto. The antenna device may include, for example, an antenna splicing device but is not limited thereto. It is noted that the electronic device may be any combination of the above but is not limited thereto. The electronic device may have peripheral systems such as a driving system, a control system, a light source system, a rack system, etc. to support a display device, an antenna device, or a splicing device. Hereinafter, a display device will be described to illustrate the content of the disclosure, but the disclosure is not limited thereto.

In the disclosure, the features in multiple different embodiments descried below may be replaced, combined, and/or mixed to form other embodiments without departing from the spirit of the disclosure. The features of the embodiments may be arbitrarily mixed and combined as long as they do not depart from or conflict with the spirit of the disclosure.

FIG. 1 is a schematic partial cross-sectional view of a display device according to some embodiments of the disclosure. Referring to FIG. 1, a display device 100 of this embodiment includes the following components sequentially from bottom to top: a substrate 110, a pixel circuit 120, a light-emitting unit 130, an encapsulation layer 140, a touch sensing unit 150, an insulating layer 160, an anti-reflection layer 170, and a cover layer 180. In this embodiment, the substrate 110 has a thickness T1. The thickness T1 is, for example, the maximum thickness of the substrate 110 measured along the normal direction of the substrate 110. The substrate 110 may include a rigid substrate, a flexible substrate, or a combination of the above. For example, the material of the substrate 110 may include glass, quartz, sapphire, ceramic, polycarbonate (PC), polyimide (PI), polyethylene terephthalate (PET), other suitable substrate materials, or combinations of the above, but is not limited thereto.

The pixel circuit 120 is disposed on the substrate 110 and includes a transistor 121. The light-emitting unit 130 is disposed on the pixel circuit 120 and is electrically connected to the transistor 121 in the pixel circuit 120.

The encapsulation layer 140 is disposed on the light-emitting unit 130. The encapsulation layer 140 includes a first insulating layer 141, a planarizing layer 142, and a second insulating layer 143. The first insulating layer 141 is disposed on the light-emitting unit 130 and has a thickness T2. The planarizing layer 142 is disposed on the first insulating layer 141 and has a thickness T3. The second insulating layer 143 is disposed on the planarizing layer 142 and has a thickness T4. The thickness T2 is, for example, the maximum thickness of the first insulating layer 141 measured along the normal direction of the substrate 110. The thickness T3 is, for example, the maximum thickness of the planarizing layer 142 measured along the normal direction of the substrate 110. The thickness T4 is, for example, the maximum thickness of the second insulating layer 143 measured along the normal direction of the substrate 110. In this embodiment, the first insulating layer 141, the planarizing layer 142, and the second insulating layer 143 may respectively have a single-layer structure or a multi-layer structure. The materials of the first insulating layer 141 and the second insulating layer 143 may include, for example, an inorganic material (e.g., silicon nitride or other suitable inorganic materials) but are not limited thereto. The material of the planarizing layer 142 may include, for example, an organic material but is not limited thereto.

In this embodiment, the thickness T4 of the second insulating layer 143 is, for example, greater than the thickness T2 of the first insulating layer 141 (i.e., T4>T2), but the disclosure is not limited thereto. The ratio of the thickness T4 of the second insulating layer 143 to the thickness T2 of the first insulating layer 141 is, for example, greater than 1 and less than or equal to 3 (i.e., 1<T4/T2≤3), but the disclosure is not limited thereto. The thickness T3 of the planarizing layer 142 is, for example, greater than the sum of the thickness T2 of the first insulating layer 141 and the thickness T4 of the second insulating layer 143 (i.e., T3>T2+T4), but the disclosure is not limited thereto. The ratio of the thickness T3 of the planarizing layer 142 to the sum (i.e., the sum of the thickness T2 of the first insulating layer 141 and the thickness T4 of the second insulating layer 143) is, for example, greater than or equal to 3 and less than or equal to 6 (i.e., 3≤T3/(T2+T4)≤6), but the disclosure is not limited thereto. In addition, in this embodiment, the thickness T2 of the first insulating layer 141 is, for example, greater than or equal to 0.5 μm and less than or equal to 1 μm (i.e., 0.5 μm≤T2≤1 μm) but is not limited thereto. The thickness T3 of the planarizing layer 142 is, for example, greater than or equal to 5 μm and less than or equal to 10 μm (i.e., 5 μm≤T3≤10 μm) but is not limited thereto. The thickness T4 of the second insulating layer 143 is, for example, greater than or equal to 0.8 μm and less than or equal to 1.5 μm (i.e., 0.8 μm≤T4≤1.5 μm) but is not limited thereto.

The touch sensing unit 150 is disposed on the encapsulation layer 140. The insulating layer 160 is disposed on the touch sensing unit 150. The anti-reflection layer 170 is disposed on the insulating layer 160 and has a thickness T5. The thickness T5 is, for example, the maximum thickness of the anti-reflection layer 170 measured along the normal direction of the substrate 110. The cover layer 180 is disposed on the anti-reflection layer 170 and has a thickness T6. The thickness T6 is, for example, the maximum thickness of the cover layer 180 measured along the normal direction of the substrate 110. In addition, in this embodiment, the thickness T1 of the substrate 110 is, for example, greater than the thickness T5 of the anti-reflection layer 170 but is not limited thereto. The thickness T6 of the cover layer 180 is, for example, greater than the thickness T5 of the anti-reflection layer 170 but is not limited thereto.

Furthermore, the display device 100 of this embodiment further includes a buffer layer 111. The buffer layer 111 is disposed between the pixel circuit 120 and the substrate 110. The buffer layer 111 may have a single-layer structure or a multi-layer structure, and the buffer layer 111 may include an organic material, an inorganic material, or a combination of the above but is not limited thereto.

Other embodiments will be provided and described below. It is noted herein that the reference numerals and part of the descriptions of the above embodiment apply to the following embodiments, where the same numerals are used to represent the same or similar components, and descriptions of the same technical contents are omitted. Reference may be made to the above embodiment for the descriptions of the omitted contents, which will not be repeated in the following embodiments.

Figure 2:
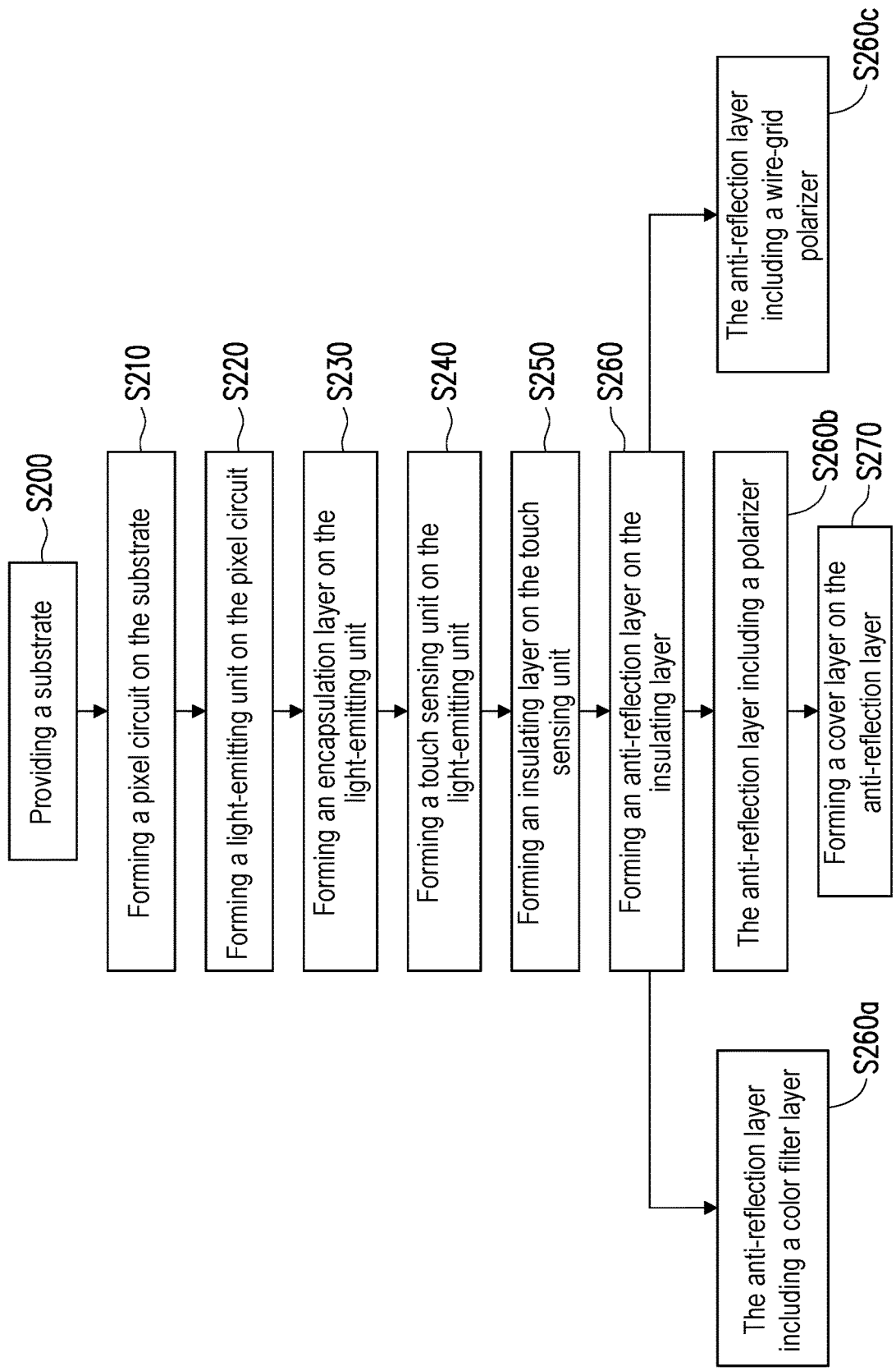
FIG. 2 is a flowchart of a method for manufacturing a display device according to an embodiment of the disclosure.

FIG. 2 is a flowchart of a method for manufacturing a display device according to an embodiment of the disclosure. FIG. 3A to FIG. 3H are cross-sectional views showing a process of a method for manufacturing a display device according to some embodiments of the disclosure. FIG. 3H' and FIG. 3H" are partial cross-sectional views of a display device according to some embodiments of the disclosure.

Figure 3A:
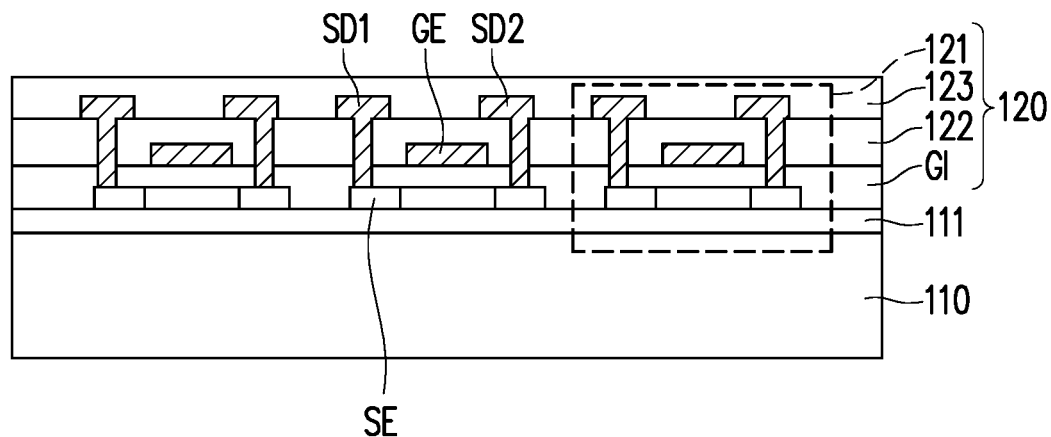
FIG. 3A to FIG. 3H are cross-sectional views showing a process of a method for manufacturing a display device according to some embodiments of the disclosure.

First, referring to FIG. 2 and FIG. 3A at the same time, in a method for manufacturing a display device 100a of this embodiment, first, step S200 and step S210 are performed to provide a substrate 110 and form a pixel circuit 120 on the substrate 110. Specifically, the pixel circuit 120 may include a transistor 121, a gate insulating layer GI, an insulating layer 122, and an insulating layer 123. The transistor 121 may include a gate electrode GE, a portion of the gate insulating layer GI, a source electrode SD1, a drain electrode SD2, and a semiconductor SE. The semiconductor SE is disposed on the substrate 110, the gate insulating layer GI is disposed on the semiconductor SE, the gate electrode GE is disposed on the gate insulating layer GI, the insulating layer 122 is disposed on the gate electrode GE, the source electrode SD1 and the drain electrode SD2 are disposed on the insulating layer 122, and the insulating layer 123 is disposed on the source electrode SD1 and the drain electrode SD2. In this embodiment, the material of the semiconductor SE may include an amorphous silicon, a low temperature polysilicon (LIPS), a metal oxide (e.g., indium gallium zinc oxide (IGZO)), other suitable materials, or a combination of the above but is not limited thereto. In other embodiments, different transistors may include different semiconductor layer materials, but the disclosure is not limited thereto. Moreover, although the transistor 121 of this embodiment is a top-gate transistor, the disclosure is not limited thereto. In other embodiments, the transistor may also include a bottom-gate transistor, a top-gate transistor, and/or a double-gate transistor, but the disclosure is not limited thereto. In addition, the display device 100a of this embodiment further includes a buffer layer 111, and the buffer layer 111 is disposed between the gate insulating layer GI of the pixel circuit 120 and the substrate 110.

Figure 3B:
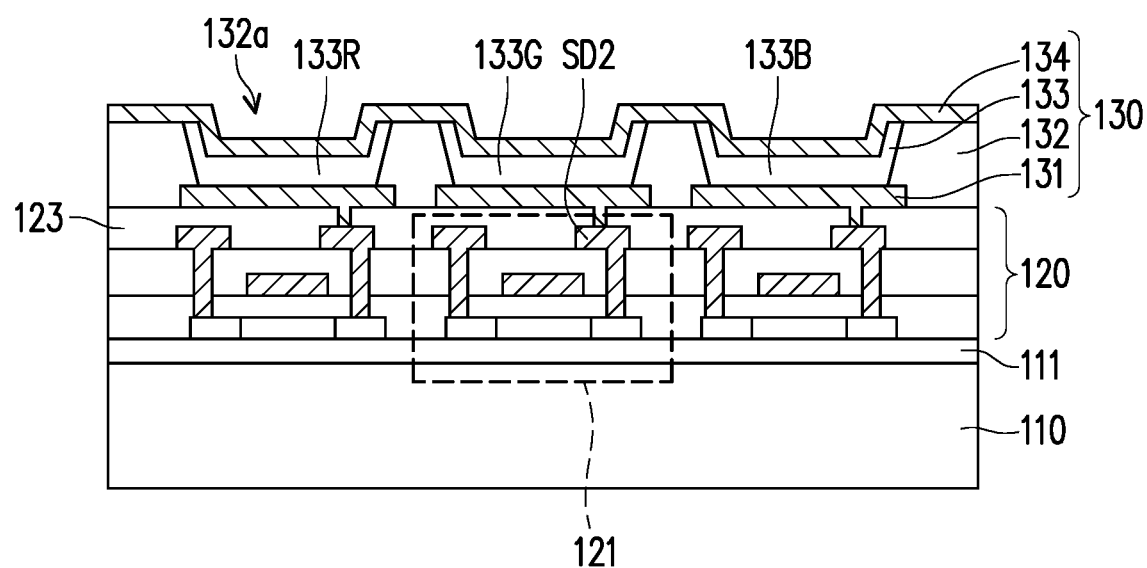

Then, referring to FIG. 2 and FIG. 3B at the same time, step S220 is performed to form a light-emitting unit 130 on the pixel circuit 120. Specifically, the light-emitting unit 130 includes a first electrode 131, an insulating layer 132, a light-emitting element 133, and a second electrode 134. The first electrode 131 is disposed on the insulating layer 123. The insulating layer 132 is disposed on the first electrode 131. The insulating layer 132 has an opening 132a to expose part of the first electrode 131. The light-emitting element 133 is disposed in the opening 132a and on the first electrode 131 to electrically connect to the drain electrode SD2 of the transistor 121 via the first electrode 131. The second electrode 134 is disposed on the insulating layer 132 and in the opening 132a and is electrically connected to the light-emitting element 133. In this embodiment, a light-emitting element 133 (e.g., an organic light-emitting diode) may be formed (e.g., by deposition, but the disclosure is not limited thereto) directly on the first electrode 131, or a light-emitting element 133 (e.g., a micro light-emitting diode) which has been completed may be placed on the first electrode 131 by indirect transfer. The light-emitting element 133 may include light-emitting diodes (LED) of different colors, e.g., a red light-emitting diode 133R, a green light-emitting diode 133G, and a blue light-emitting diode 133B, but is not limited thereto.

Figure 3C:
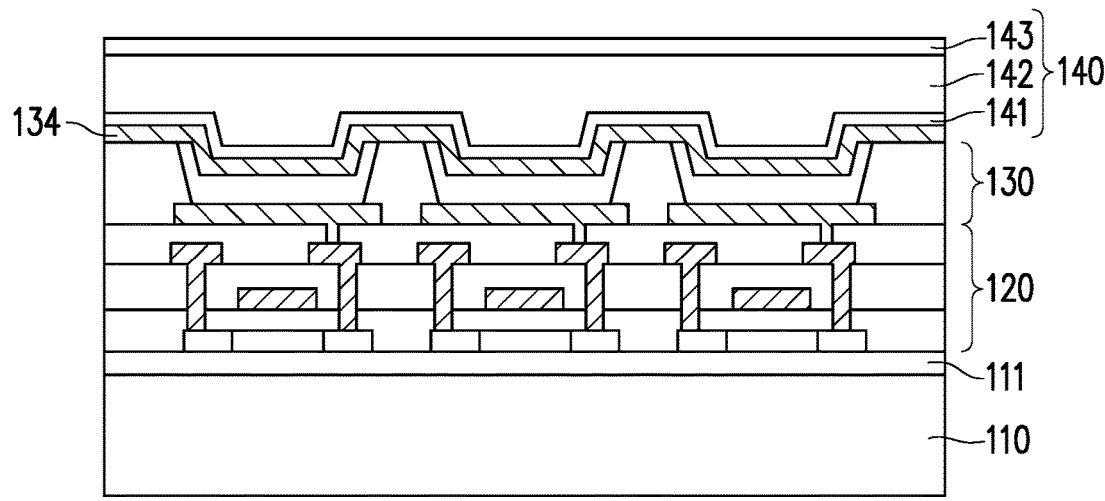

Next, referring to FIG. 2 and FIG. 3C at the same time, step S230 is performed to form an encapsulation layer 140 on the light-emitting unit 130. Specifically, the encapsulation layer 140 has a multi-layer structure, including a first insulating layer 141, a planarizing layer 142, and a second insulating layer 143. The first insulating layer 141 is disposed on the second electrode 134 of the light-emitting unit 130. The planarizing layer 142 is disposed on the first insulating layer 141. The second insulating layer 143 is disposed on the planarizing layer 142. The first insulating layer 141 and the second insulating layer 143 are respectively located on two opposite sides of the planarizing layer 142. In addition, the arrangement of the planarizing layer 142 may provide a substantially flat surface. Specifically, for example, thicknesses may be measured along the normal direction of the substrate 110 from the surface of the planarizing layer 142 to the surface of the substrate 110, and when the difference between any two thicknesses is less than or equal to 1 µm, the planarizing layer 142 may be regarded as flat, so that the subsequently manufactured layer (e.g., an anti-reflection layer 170) may have a better effect.

Figure 3D:
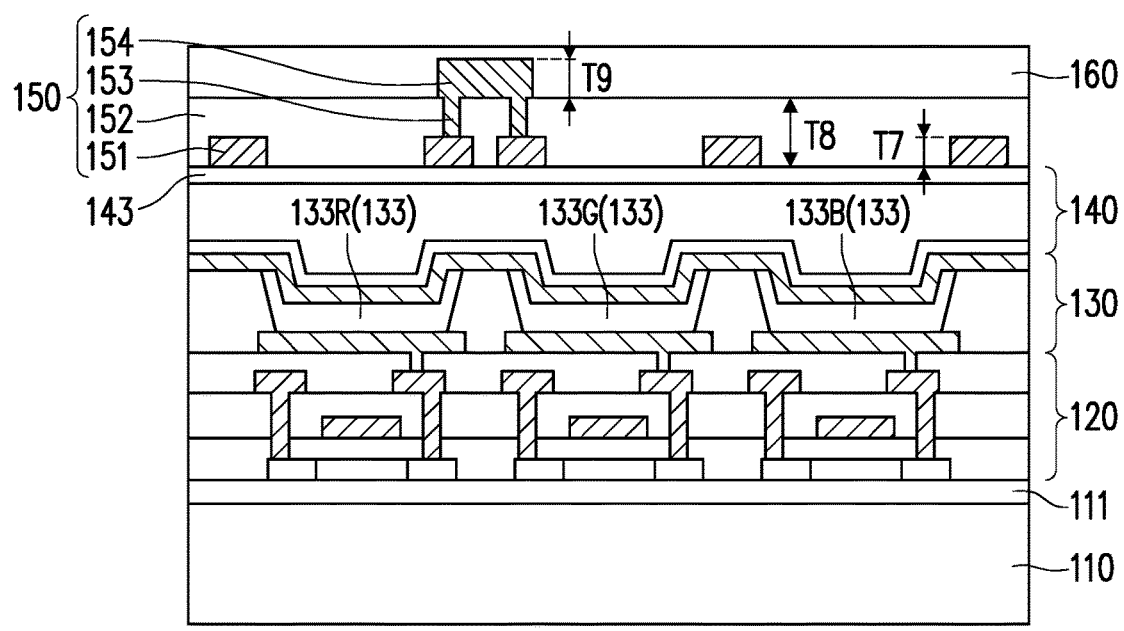

Then, referring to FIG. 2 and FIG. 3D at the same time, step S240 and step S250 are performed to form a touch sensing unit 150 on the light-emitting unit 130 and form an insulating layer 160 on the touch sensing unit 150. Specifically, the touch sensing unit 150 may include a first metal layer 151, an insulating layer 152, a conductive via 153, and a second metal layer 154, and the first metal layer 151 and the second metal layer 154 may include a patterned conductive layer, but the disclosure is not limited thereto. The first metal layer 151 is disposed on the second insulating layer 143 of the encapsulation layer 140. The first metal layer 151 is disposed corresponding to a non-light-emitting region 101 and is not disposed corresponding to light-emitting regions 102R, 102G, and 102B. Since the light-emitting element 133 of this embodiment emits light in a direction away from the substrate 110, the light-emitting regions 102R, 102G, and 102B are disposed corresponding to the light-emitting direction of the light-emitting element 133. In other words, the light-emitting regions 102R, 102G, and 102B may be defined as regions that overlap with the light-emitting element 133 (the red light-emitting diode 133R, the green light-emitting diode 133G, and the blue light-emitting diode 133B) in the light-emitting direction of the light-emitting element 133 (the red light-emitting diode 133R, the green light-emitting diode 133G, and the blue light-emitting diode 133B), and the non-light-emitting region 101 may be defined as a region that does not overlap with the light-emitting element 133 (the red light-emitting diode 133R, the green light-emitting diode 133G, and the blue light-emitting diode 133B) in the light-emitting direction of the light-emitting element 133 (the red light-emitting diode 133R, the green light-emitting diode 133G, and the blue light-emitting diode 133B). The insulating layer 152 is disposed on the first metal layer 151. The second metal layer 154 is disposed on the insulating layer 152 and is electrically connected to the first metal layer 151 via the conductive via 153 penetrating the insulating layer 152. In this embodiment, the materials of the first metal layer 151 and the second metal layer 154 may include, for example, a stack of three metal layers, in which the first layer and the third layer are titanium, and the second layer located between the first layer and the third layer is aluminum, but the disclosure is not limited thereto. The insulating layer 152 may have a single-layer structure or a multi-layer structure, and the insulating layer 152 may include an inorganic material (e.g., silicon nitride or other suitable inorganic materials) but is not limited thereto.

In this embodiment, a thickness T7 of the first metal layer 151 is, for example, greater than or equal to 0.1 µm and less than or equal to 0.4 µm (i.e., $0.1\ \mu m \leq T7 \leq 0.4\ \mu m$) but is not limited thereto. A thickness T8 of the insulating layer 152 is, for example, greater than or equal to 0.1 µm and less than or equal to 0.4 µm (i.e., $0.1\ \mu m \leq T8 \leq 0.4\ \mu m$) but is not limited thereto. A thickness T9 of the second metal layer 154 is, for example, greater than or equal to 0.2 µm and less than or equal to 0.5 µm (i.e., $0.2\ \mu m \leq T9 \leq 0.5\ \mu m$) but is not limited thereto. If the thickness T7 of the first metal layer 151 is less than 0.1 µm or the thickness T9 of the second metal layer 154 is less than 0.2 µm, the impedance will increase and signal transmission will be affected. If the thickness T7 of the first metal layer 151 is greater than 0.4 µm or the thickness T9 of the second metal layer 154 is greater than 0.5 µm, the topography will be uneven, which will affect the polarization effect of a subsequently manufactured anti-reflection layer 170. In addition, in this embodiment, the thickness T9 of the second metal layer 154 is, for example, greater than the thickness T7 of the first metal layer 151 (i.e., T9>T7) but is not limited thereto. The thickness T9 of the second metal layer 154 is, for example, greater than the thickness T8 of the insulating layer 152, and the thickness T8 of the insulating layer 152 is, for example, greater than the thickness T7 of the first metal layer 151 (i.e., T9>T8>T7), but the disclosure is not limited thereto. The ratio of the thickness T9 of the second metal layer 154 to the thickness T7 of the first metal layer 151 is, for example, greater than or equal to 1 and less than or equal to 1.5 (i.e., $1 \leq T9/T7 \leq 1.5$), but the disclosure is not limited thereto.

In this embodiment, the insulating layer 160 is disposed on the insulating layer 152 and the second metal layer 154 of the touch sensing unit 150. The insulating layer 160 may have a single-layer structure or a multi-layer structure, and the insulating layer 160 may include an organic material, an inorganic material, or a combination of the above but is not limited thereto.

Then, referring to FIG. 2, FIG. 3E, FIG. 3F, and FIG. 3G at the same time, step S260 and step S260a are performed to form an anti-reflection layer 170 on the insulating layer 160. The anti-reflection layer 170 may include, for example, a patterned anti-reflection layer but is not limited thereto, and the anti-reflection layer 170 may include a color filter layer 171R, a color filter layer 171G, and a color filter layer 171B. In this embodiment, the anti-reflection layer 170 is formed on the insulating layer 160 by, for example, a semiconductor manufacturing process, and is not provided by adhering an anti-reflection layer which has been completed onto the insulating layer 160 through an adhesive layer. In this embodiment, the anti-reflection layer 170 may be formed directly on the insulating layer 160, so that there is no other layer between the anti-reflection layer 170 and the insulating layer 160. In this embodiment, the anti-reflection layer 170 may be formed on the insulating layer 160 by, for example, an ink-jet printing process, but disclosure does not specifically limit the formation method of the anti-reflection layer 170. Specifically, referring to FIG. 3E, by an ink-jet printing process, the red color filter layer 171R is formed on the insulating layer 160 and is disposed corresponding to the light-emitting region 102R (i.e., the light-emitting region of the red light-emitting diode 133R) and the non-light-emitting region 101, but is not disposed corresponding to the light-emitting region 102G (i.e., the light-emitting region of the green light-emitting diode 133G) and the light-emitting region 102B (i.e., the light-emitting region of the blue light-emitting diode 133B). Next, referring to FIG. 3F, the green color filter layer 171G is formed on the insulating layer 160 and the color filter layer 171R and is disposed corresponding to the light-emitting region 102G and the non-light-emitting region 101, but is not disposed corresponding to the light-emitting region 102R and the light-emitting region 102B. Next, referring to FIG. 3G, the blue color filter layer 171B is formed on the insulating layer 160 and the color filter layer 171G and is disposed corresponding to the light-emitting region 102B and the non-light-emitting region 101, but is not disposed corresponding to the light-emitting region 102R and the light-emitting region 102G. The stack of three color filter layers (i.e., the stack of the color filter layer 171R, the color filter layer 171G, and the color filter layer 171B) disposed on the non-light-emitting region 101 may have a light-shielding effect. So far, the anti-reflection layer 170 of this embodiment has been completed.

Figure 3E:
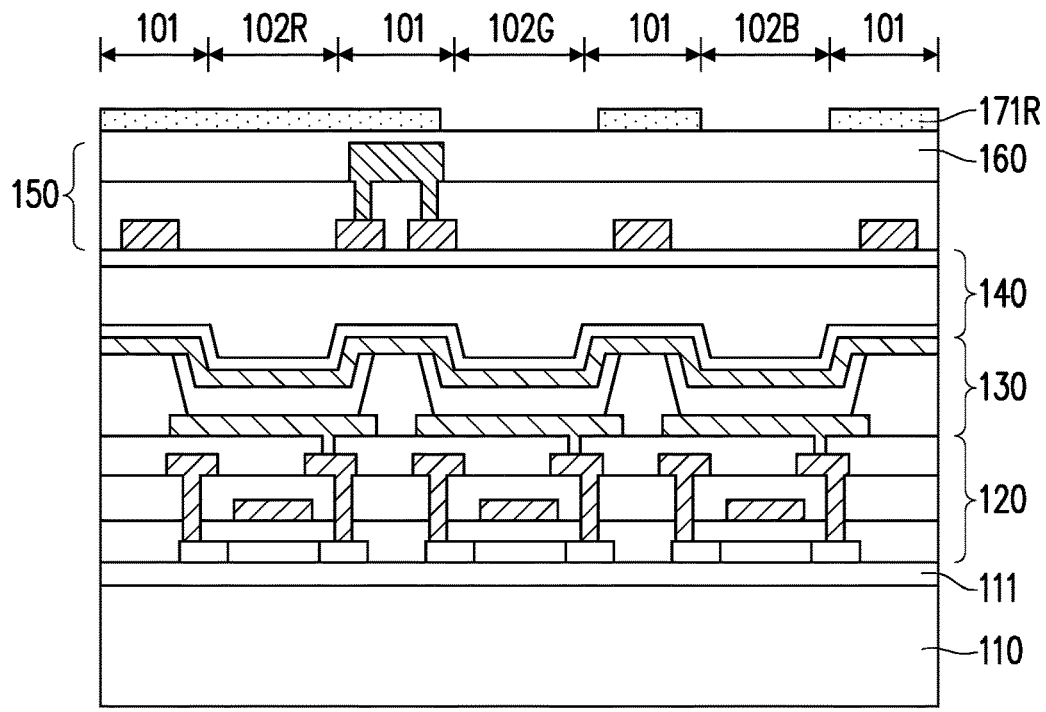
Figure 3F:
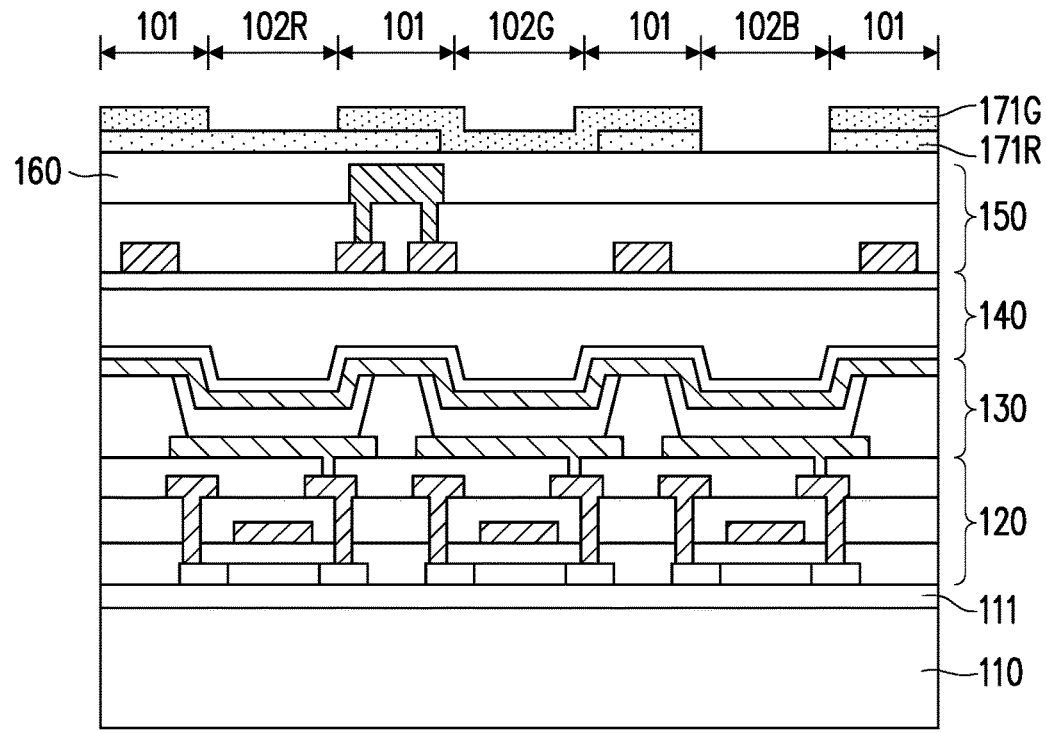
Figure 3G:
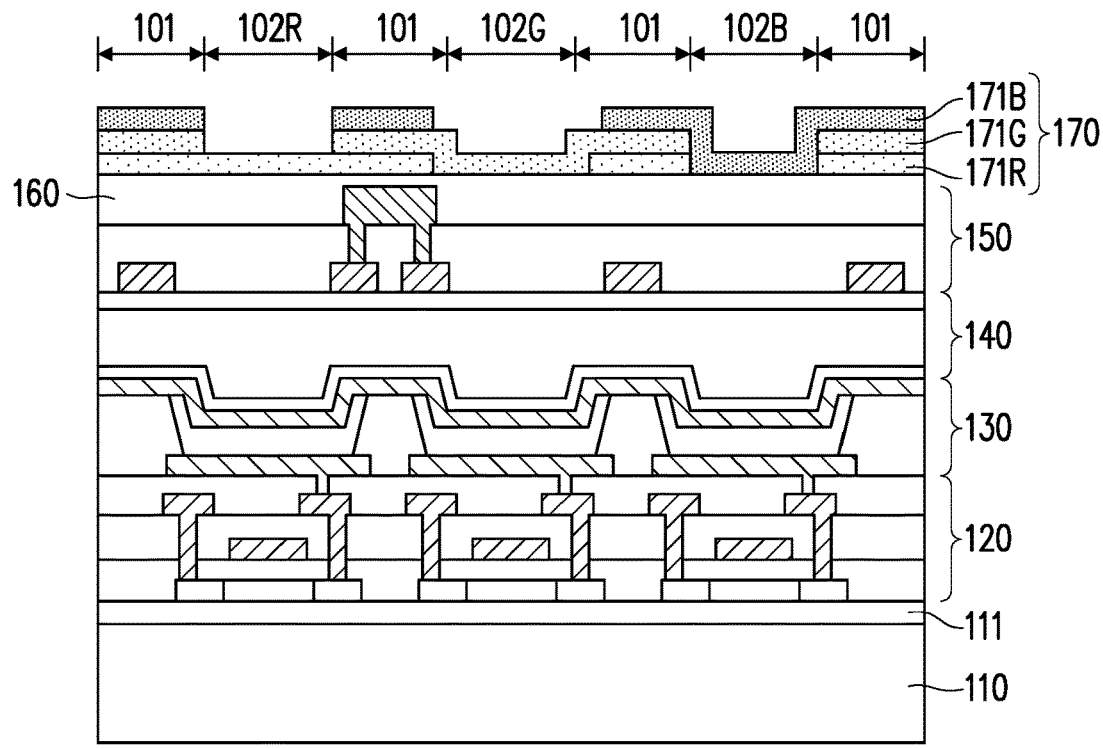
Figure 3H:
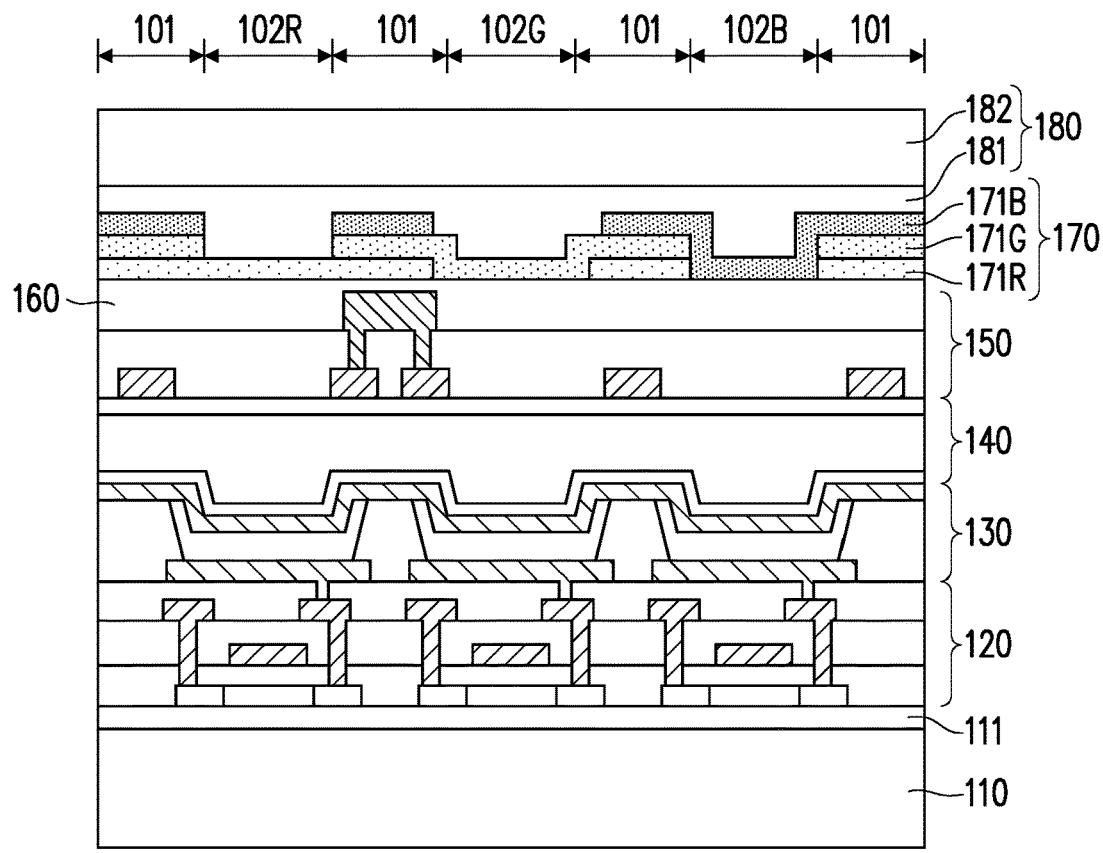
Figure 3H:
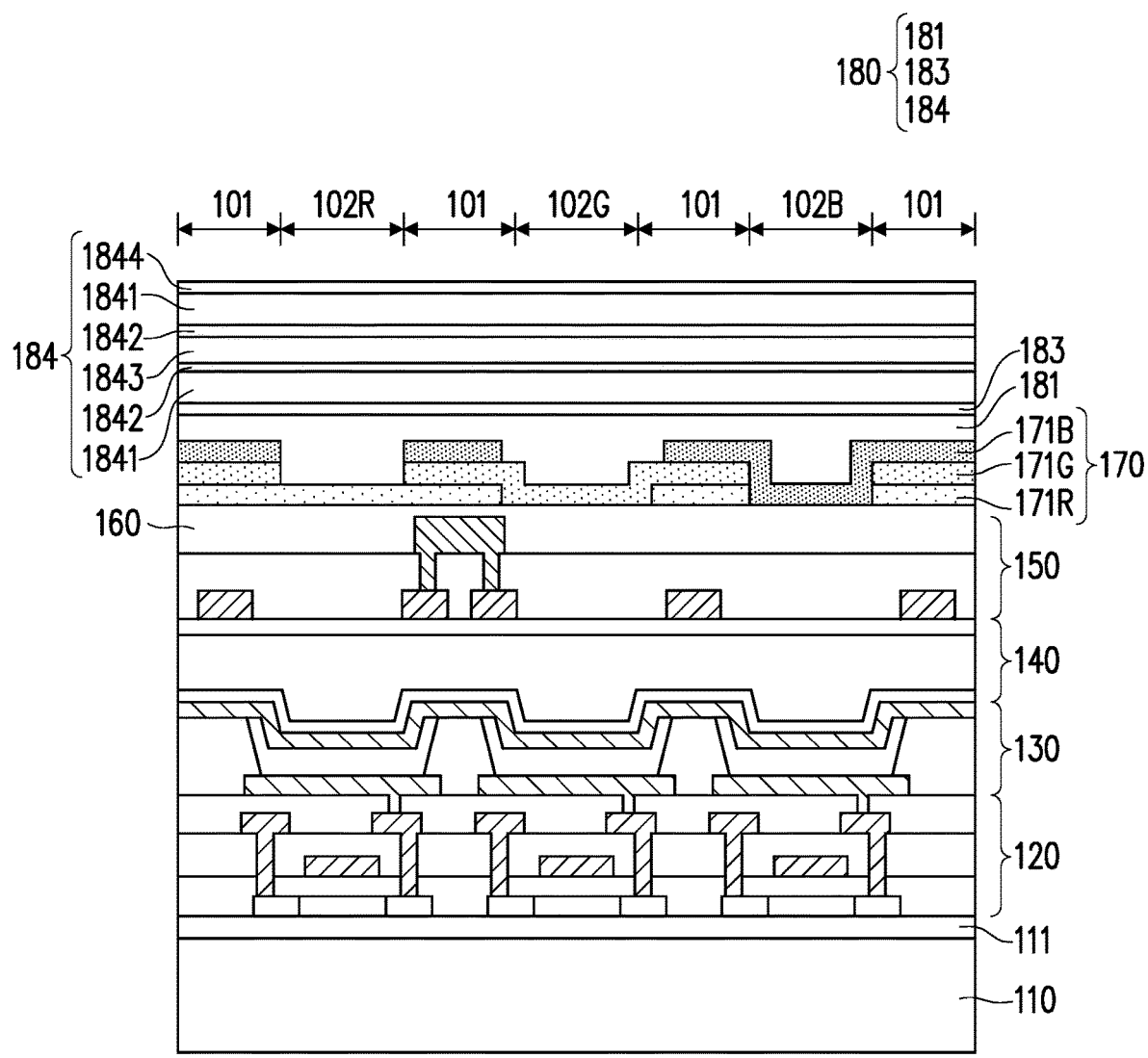

In some embodiments, the anti-reflection layer 170 may also be formed on the insulating layer 160 by, for example, a coating process, and the anti-reflection layer 170 may also be formed on the insulating layer 160 by, for example, a photolithography process. Specifically, one layer of red color filter layer 171R is formed on the insulating layer 160 by a coating process, so that the red color filter layer 171R covers the light-emitting region 102R, the light-emitting region 102G, the light-emitting region 102B, and the non-light-emitting region 101 (not shown). Next, the red color filter layer 171R is etched by a photolithography process to etch the color filter layer 171R on the light-emitting region 102G and the light-emitting region 102B and expose the insulating layer 160, as shown in FIG. 3E. Then, according to steps similar to those described above, the green color filter layer 171G is formed by a coating process and a photolithography process, so that the green color filter layer 171G is disposed in the light-emitting region 102G and the non-light-emitting region 101, and the color filter layer 171R of the light-emitting region 102R and the insulating layer 160 of the light-emitting region 102B are exposed, as shown in FIG. 3F. Then, according to steps similar to those described above, the blue color filter layer 171B is formed by a coating process and a photolithography process, so that the blue color filter layer 171B is disposed in the light-emitting region 102B and the non-light-emitting region 101, and the color filter layer 171R of the light-emitting region 102R and the color filter layer 171G of the light-emitting region 102G are exposed, as shown in FIG. 3G.

Although in the method for manufacturing the display device 100*a* of this embodiment, the red color filter layer 171R is formed first, and then the green color filter layer 171G and the blue color filter layer 171B are formed, the disclosure does not specifically limit the sequence of forming the color filter layer. In some embodiments, the green color filter layer 171G or the blue color filter layer 171B may also be formed first.

Then, referring to FIG. 2 and FIG. 3H at the same time, step S270 is performed to form a cover layer 180 on the anti-reflection layer 170. In this embodiment, the cover layer 180 may be formed on the anti-reflection layer 170 by a coating process, but the disclosure does not specifically limit the formation method of the cover layer 180. Specifically, the cover layer 180 includes a planarizing layer 181 and a planarizing layer 182. In this embodiment, by a coating process, the planarizing layer 181 is first formed on the color filter layer 171R of the light-emitting region 102R, on the color filter layer 171G of the light-emitting region 102G, on the color filter layer 171B of the light-emitting region 102B, and on the color filter layer 171B of the non-light-emitting region 101 to perform planarization. Then, the planarizing layer 182 is formed on the planarizing layer 181 by a coating process. The planarizing layer 181 and the planarizing layer 182 may have a single-layer structure or a multi-layer structure, and the planarizing layer 181 and the planarizing layer 182 may include an organic material but are not limited thereto. For example, the planarizing layer 181 and the planarizing layer 182 may include polyethylene terephthalate, polyimide, or a combination of the above but are not limited thereto. So far, the display device 100*a* of this embodiment has been completed.

In some embodiments, the cover layer 180 may also be formed on the anti-reflection layer 170 by, for example, a coating process and an adhesion process. Referring to FIG. 3H', the cover layer 180 includes a planarizing layer 181, an adhesive layer 183, and a substrate 184. Specifically, by a coating process, the planarizing layer 181 is first formed on the color filter layer 171R of the light-emitting region 102R, on the color filter layer 171G of the light-emitting region 102G, on the color filter layer 171B of the light-emitting region 102B, and on the color filter layer 171B of the non-light-emitting region 101 to perform planarization. Next, the adhesive layer 183 is formed on the planarizing layer 181 by a coating process. Then, the substrate 184 is adhered onto the adhesive layer 183. The substrate 184 may have a multi-layer structure, and may include a resin layer 1841, an adhesive layer 1842, a glass 1843, and a hard coating layer 1844 but is not limited thereto. In other embodiments, a substrate 184*a* may also include a resin layer 1841, an adhesive layer 1842, a resin layer 1845, and a hard coating layer 1844, as shown in FIG. 3H". The adhesive layer 183 and the adhesive layer 1842 may include an optical adhesive (OCA), the material of the resin layer 1841 may include polyethylene terephthalate, the material of the hard coating layer 1844 may include poly(methyl methacrylate) (PMMA), and the material of the resin layer 1845 may include colorless polyimide, but the disclosure is not limited thereto.

Figure 9:
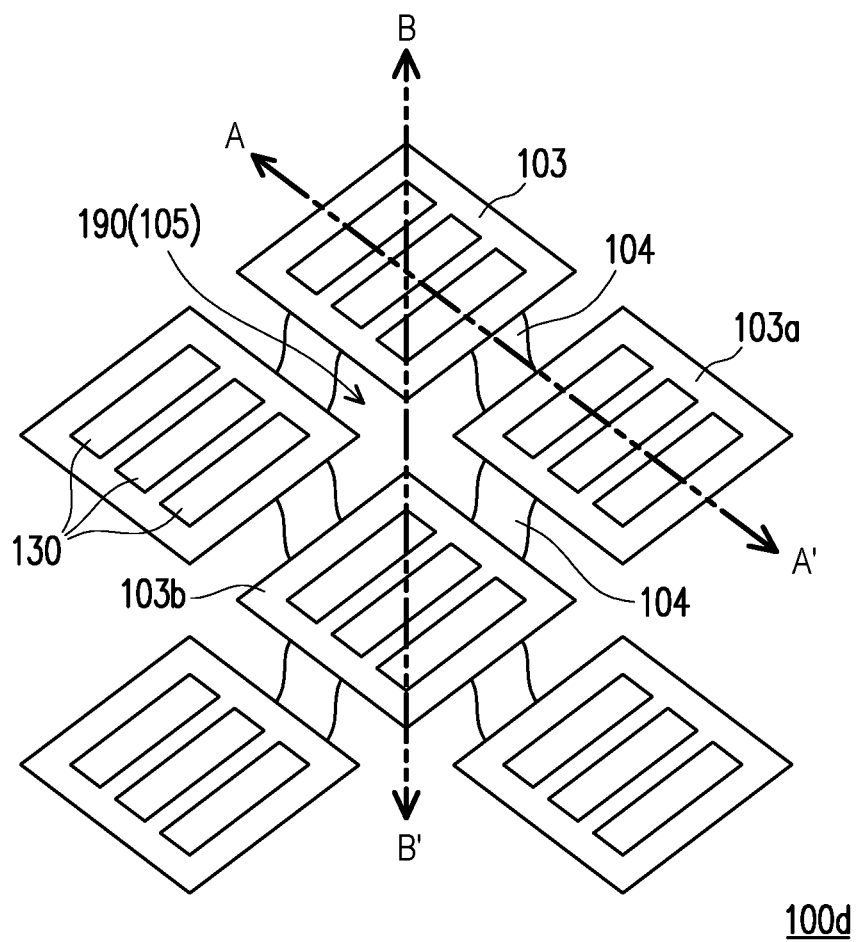
FIG. 9 is a schematic top view of a display device according to another embodiment of the disclosure.

In brief, in the method for manufacturing the display device 100*a* of the embodiment of the disclosure, compared to a method of attaching an anti-reflection layer externally onto the insulating layer, the method of forming the anti-reflection layer 170 on the insulating layer 160 in the embodiment of the disclosure can reduce the overall thickness, reduce the bending stress, improve the reliability, or increase the service life. For example, when the display device 100*a* is a foldable display device or a stretchable display device (as shown in FIG. 9), and when the display device is to be bent, rolled, or stretched, compared to the method of attaching an anti-reflection layer externally onto the insulating layer, the method of forming the anti-reflection layer 170 on the insulating layer 160 in the embodiment of the disclosure can reduce the bending stress to suppress separation of the anti-reflection layer, which thereby improves the reliability of the display device or increases the service life of the display device.

Figure 4:
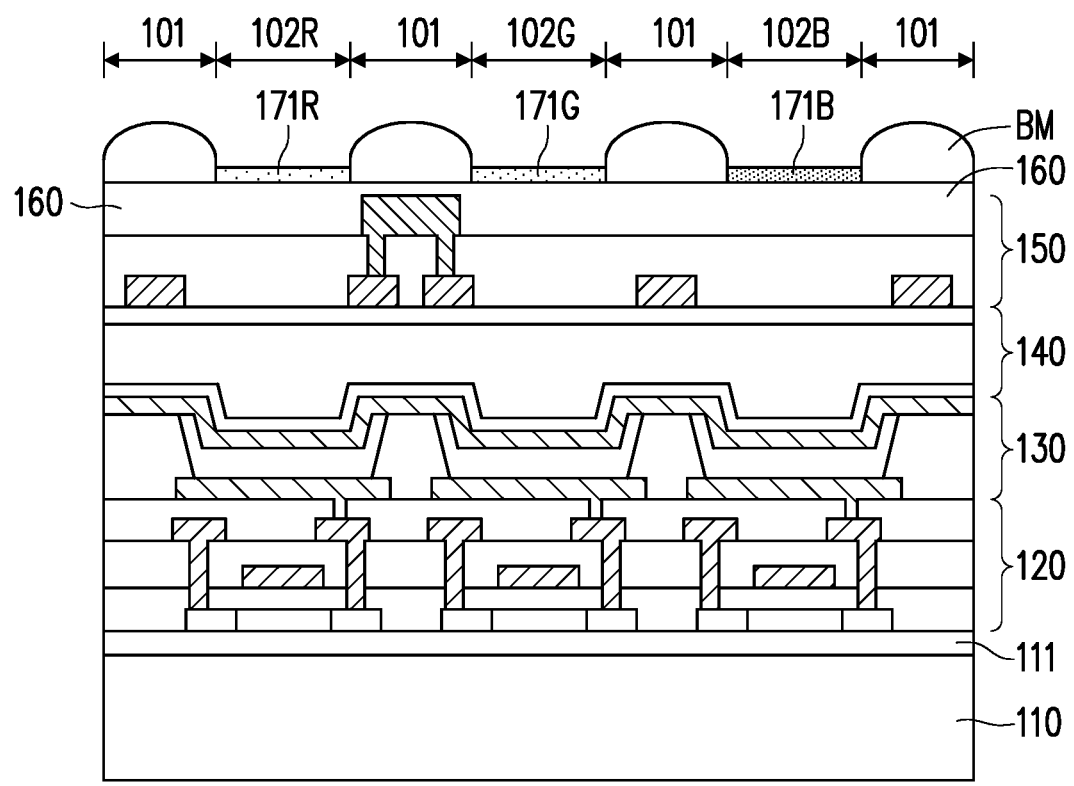
FIG. 4 is a cross-sectional view showing a process of a method for manufacturing a display device according to another embodiment of the disclosure.

FIG. 4 is a cross-sectional view showing a process of a method for manufacturing a display device according to another embodiment of the disclosure. FIG. 4 shows a step continuing FIG. 3D and replacing FIG. 3E to FIG. 3G. The same materials or methods may apply to the same or similar components in the embodiment of FIG. 4 and the embodiment of FIG. 3A to FIG. 3H, so the same and similar descriptions in the two embodiments will not be repeated herein, and the main difference between the two embodiments will be described.

Referring to FIG. 4, a black matrix layer BM is formed on the insulating layer 160. The black matrix layer BM may include a patterned black matrix layer and is disposed corresponding to the non-light-emitting region 101. The black matrix layer BM may expose the light-emitting region 102R, the light-emitting region 102G, and the light-emitting region 102B on the insulating layer 160. Then, by an ink-jet printing process, a red color filter layer 171R is formed on the insulating layer 160 and is disposed corresponding to the light-emitting region 102R, a green color filter layer 171G is formed on the insulating layer 160 and is disposed corresponding to the light-emitting region 102G, and a blue color filter layer 171B is formed on the insulating layer 160 and is disposed corresponding to the light-emitting region 102B. Therefore, in this embodiment, the black matrix layer BM replaces the stack of three color filter layers located in the non-light-emitting region 101 in FIG. 3G and may have the effect of shielding light or as a blocking wall. The expression "corresponding to" described in the disclosure may mean, for example, that at least part of a component A and at least part of a component B overlap with each other in the normal direction of the substrate 110, or the component A and the component B completely overlap with each other.

Figure 5A:
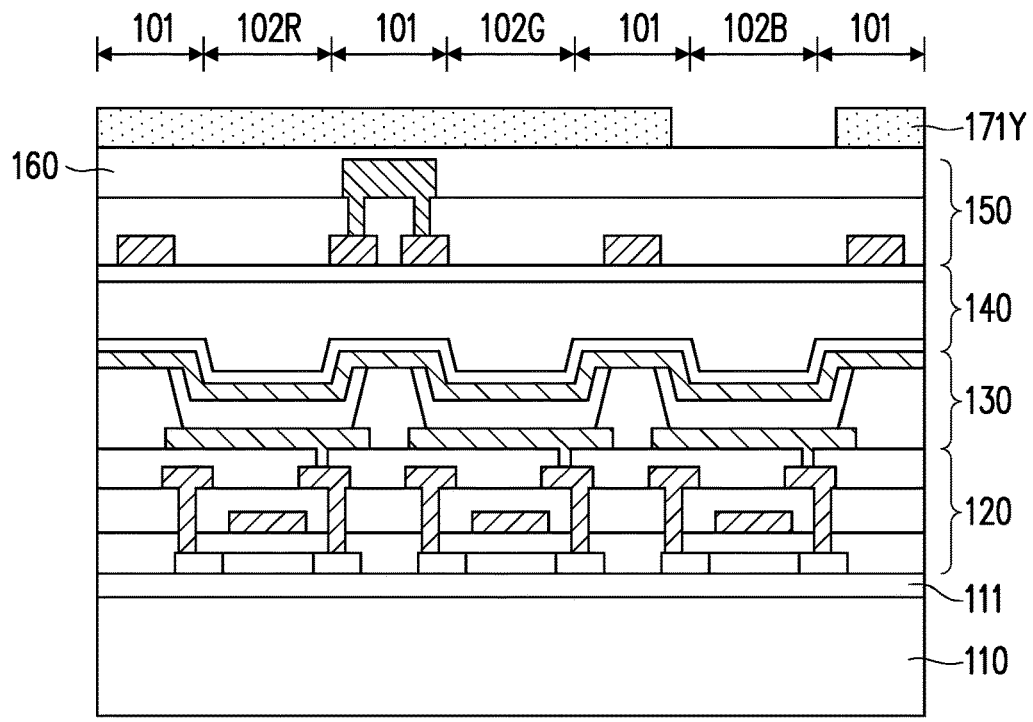
FIG. 5A and FIG. 5B are cross-sectional views showing a process of a method for manufacturing a display device according to another embodiment of the disclosure.
Figure 5B:
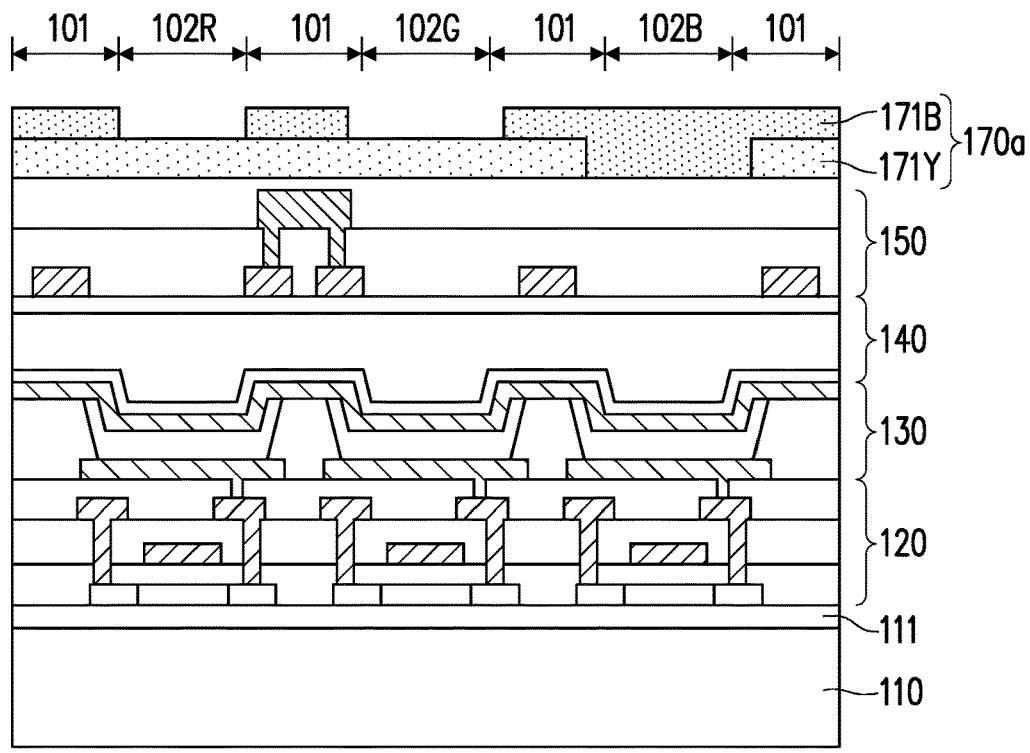

FIG. 5A and FIG. 5B are cross-sectional views showing a process of a method for manufacturing a display device according to another embodiment of the disclosure. FIG. 5A and FIG. 5B show steps continuing FIG. 3D and replacing FIG. 3E to FIG. 3G. The same materials or methods may apply to the same or similar components in the embodiment of FIG. 5A to FIG. 5B and the embodiment of FIG. 3A to FIG. 3H, so the same and similar descriptions in the two embodiments will not be repeated herein, and the main difference between the two embodiments will be described.

Referring to FIG. 5A, the anti-reflection layer 170a of this embodiment includes a yellow color filter layer 171Y and a blue color filter layer 171B. Specifically, by an ink-jet printing process (or a coating process and a photolithography process), the yellow color filter layer 171Y is first formed on the insulating layer 160 and is disposed corresponding to the light-emitting region 102R, the light-emitting region 102G, and the non-light-emitting region 101, but is not disposed corresponding to the light-emitting region 102B. Then, the blue color filter layer 171B is formed on the insulating layer 160 and the color filter layer 171Y by the above method and is disposed corresponding to the light-emitting region 102B and the non-light-emitting region 101, but is not disposed corresponding to the light-emitting region 102R and the light-emitting region 102G. The stack of two color filter layers (i.e., the stack of the color filter layer 171Y and the color filter layer 171B) disposed on the non-light-emitting region 101 may have a light-shielding effect.

Figure 6A:
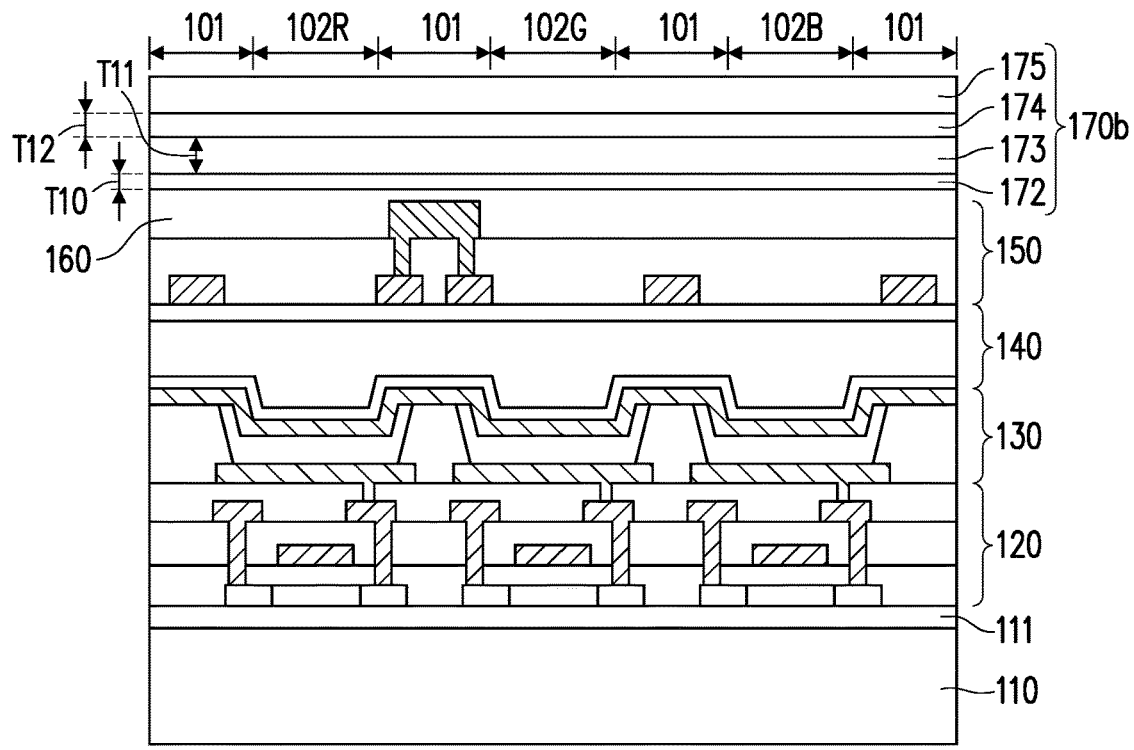
FIG. 6A and FIG. 6B are respectively cross-sectional views showing a process of a method for manufacturing a display device according to some embodiments of the disclosure.
Figure 6B:
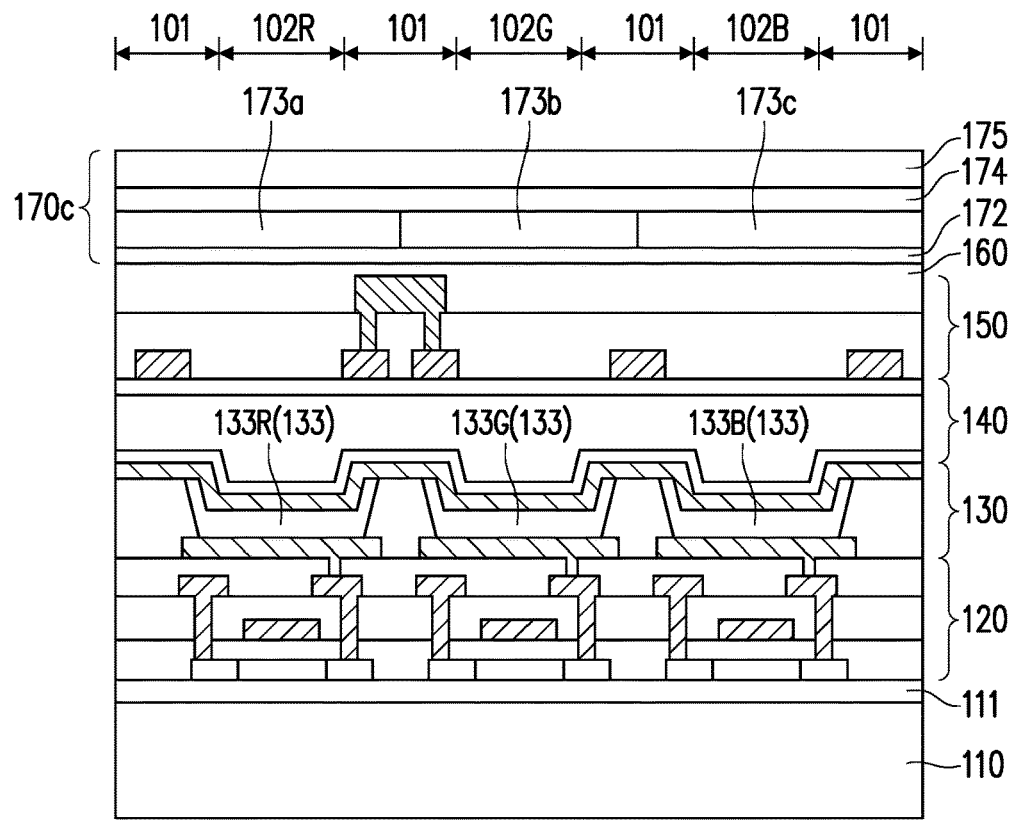

FIG. 6A and FIG. 6B are respectively cross-sectional views showing a process of a method for manufacturing a display device according to some embodiments of the disclosure. FIG. 6A (or FIG. 6B) shows a step continuing FIG. 3D and replacing FIG. 3E to FIG. 3G. The same materials or methods may apply to the same or similar components in the embodiment of FIG. 6A (or the embodiment of FIG. 6B) and the embodiment of FIG. 3A to FIG. 3H, so the same and similar descriptions in the two embodiments will not be repeated herein, and the main difference between the two embodiments will be described.

Referring to FIG. 2 and FIG. 6A, step S260 and step S260b are performed to form an anti-reflection layer 170b on the insulating layer 160, and the anti-reflection layer 170b includes a polarizer 173. In this embodiment, the anti-reflection layer 170b may have a multi-layer structure, a continuous structure, or a patterned structure, and the anti-reflection layer 170b further includes a first intermediate layer 172, a second intermediate layer 174, and a linear polarizer 175. The first intermediate layer 172 is disposed on the insulating layer 160, the second intermediate layer 174 is disposed on the polarizer 173, and the linear polarizer 175 is disposed on the second intermediate layer 174. The first intermediate layer 172 and the second intermediate layer 174 are respectively disposed on two sides of the polarizer 173 to protect the polarizer 173 and increase attachment between the polarizer 173 and the insulating layer 160 (or the linear polarizer 175). In some embodiments, in the anti-reflection layer 170b, the polarizer 173 may also be disposed directly on the insulating layer 160, and the linear polarizer 175 may be disposed directly on the polarizer 173 without the first intermediate layer 172 and the second intermediate layer 174 (not shown). In this embodiment, the first intermediate layer 172, the polarizer 173, and the second intermediate layer 174 are sequentially formed directly on the insulating layer 160 by, for example, a coating process. The first intermediate layer 172, the polarizer 173, and the second intermediate layer 174 are all disposed corresponding to the light-emitting region 102R, the light-emitting region 102G, the light-emitting region 102B, and the non-light-emitting region 101. In this embodiment, the materials of the first intermediate layer 172 and the second intermediate layer 174 may include an organic material. In other embodiments of the disclosure, the first intermediate layer 172 and the second intermediate layer 174 may optionally not include an adhesive material, but the disclosure is not limited thereto. The material of the polarizer 173 includes, for example, a quarter wave plate (QWP). The wavelength of the polarizer 173 is, for example, the average value of the red wavelength, the green wavelength, and the blue wavelength, and is, for example, 550 nanometers (nm), but the disclosure is not limited thereto. In addition, in this embodiment, a thickness T10 of the first intermediate layer 172 is, for example, 0.01 μm to 0.1 μm but is not limited thereto. A thickness T11 of the polarizer 173 is, for example, 1000 μm to 5000 μm but is not limited thereto. A thickness T12 of the second intermediate layer 174 is, for example, 0.05 μm to 1 μm but is not limited thereto.

Next, the linear polarizer 175 is formed directly on the second intermediate layer 174 by, for example, a coating process, and processes of aligning and baking (e.g., at 80° C. to 100° C., but the disclosure is not limited thereto) the linear polarizer 175 are performed, but the disclosure is not limited thereto. In some embodiments, the linear polarizer 175 may also be formed on the second intermediate layer 174 by, for example, a blade coating process, and the linear polarizer 175 may be aligned at the same time; then, the baking process of the linear polarizer 175 is performed. The alignment may include, for example, causing molecules in the linear polarizer 175 to be arranged in an orderly manner, so that the linear polarizer 175 can have a polarization function in a specific direction.

Referring to FIG. 6B, an anti-reflection layer 170c of this embodiment is similar to the anti-reflection layer 170b of FIG. 6A, and the main difference between the two lies in that the anti-reflection layer 170c of this embodiment may include a polarizer 173a, a polarizer 173b, and a polarizer 173c designed for the light-emitting element 133 of different colors (the red light-emitting diode 133R, the green light-emitting diode 133G, and the blue light-emitting diode 133B). The polarizer 173a is disposed corresponding to at least the light-emitting region 102R but is not disposed corresponding to the light-emitting region 102G and the light-emitting region 102B, the polarizer 173b is disposed corresponding to at least the light-emitting region 102G but is not disposed corresponding to the light-emitting region 102R and light-emitting region 102B, and the polarizer 173c is disposed corresponding to at least the light-emitting region 102B but is not disposed corresponding to the light-emitting region 102R and the light-emitting region 102G. In addition, the wavelength of the polarizer 173a is, for example, ¼ of the red wavelength, the wavelength of the polarizer 173b is, for example, ¼ of the green wavelength, and the wavelength of the polarizer 173c is, for example, ¼ of the blue wavelength, but the disclosure is not limited thereto.

Figure 7:
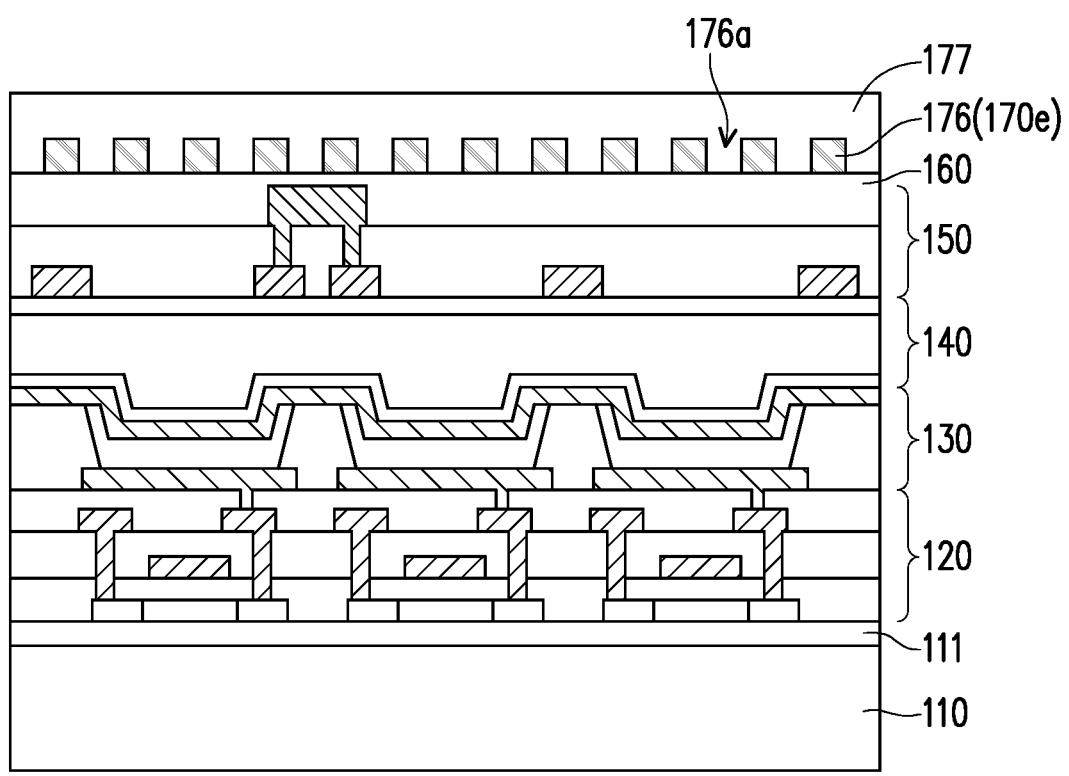
FIG. 7 is a cross-sectional view showing a process of a method for manufacturing a display device according to another embodiment of the disclosure.

FIG. 7 is a cross-sectional view showing a process of a method for manufacturing a display device according to another embodiment of the disclosure. FIG. 7 shows a step continuing FIG. 3D and replacing FIG. 3E to FIG. 3G. The same materials or methods may apply to the same or similar components in the embodiment of FIG. 7 and the embodiment of FIG. 3A to FIG. 3H, so the same and similar descriptions in the two embodiments will not be repeated herein, and the main difference between the two embodiments will be described.

Referring to FIG. 2 and FIG. 7, step S260 and step S260c are performed to form an anti-reflection layer 170e on the insulating layer 160. The anti-reflection layer 170e includes a wire-grid polarizer (WGP) 176, and the wire-grid polarizer 176 may include a patterned wire-grid polarizer. In this embodiment, for example, the following two methods are adopted to form the wire-grid polarizer 176 directly on the insulating layer 160, but the disclosure is not limited thereto. In the first method, first, the wire-grid polarizer 176 is deposited on the insulating layer 160 to directly cover the insulating layer 160; next, a plurality of openings 176a are formed by a photolithography process to expose the insulating layer 160; and then, a blackening treatment (e.g., oxidation) is performed to reduce reflection caused by the wire-grid polarizer 176. In the second method, the wire-grid polarizer 176 is formed directly on the insulating layer 160 by nanoimprint lithography, so that the wire-grid polarizer 176 directly covers the insulating layer 160 and has a plurality of openings 176a exposing the insulating layer 160; and then, a blackening treatment (e.g., oxidation) is performed to reduce reflection caused by the wire-grid polarizer 176. Next, after the wire-grid polarizer 176 is formed on the insulating layer 160, an insulating layer 177 is formed on the wire-grid polarizer 176 and in the openings 176a of the wire-grid polarizer 176. In this embodiment, the material of the wire-grid polarizer 176 may include aluminum, silver, platinum, gold, or a metal compound but is not limited thereto.

Figure 8A:
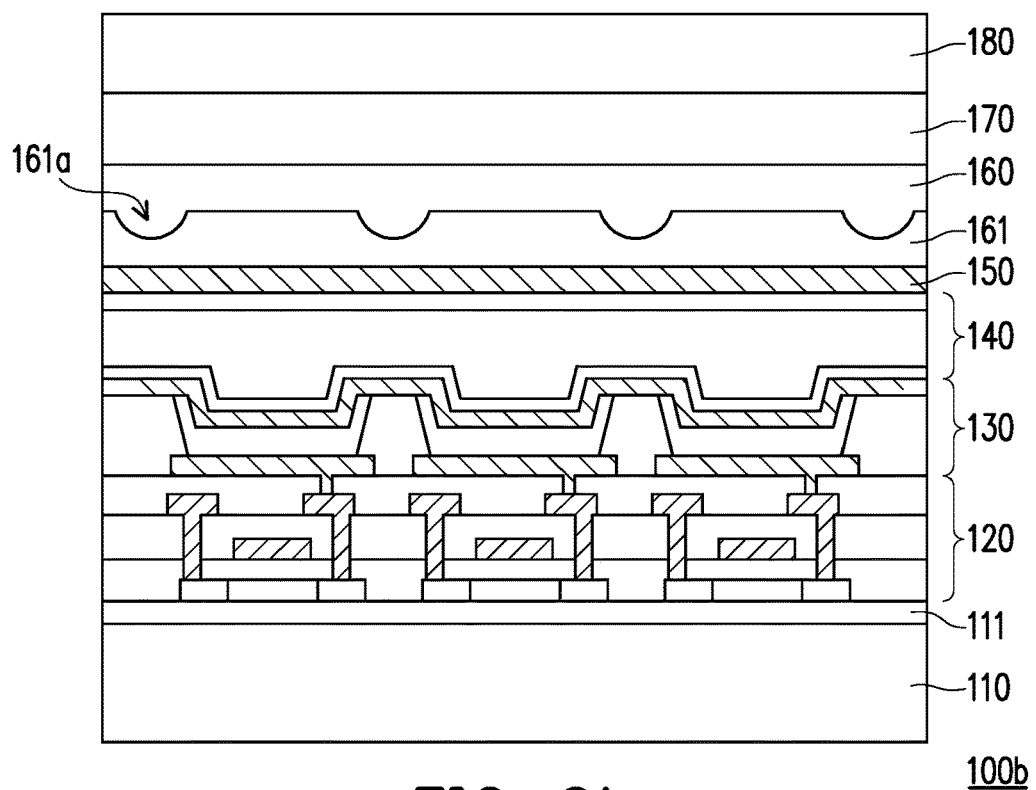
FIG. 8A and FIG. 8B are schematic partial cross-sectional views of a display device according to some embodiments of the disclosure.
Figure 8B:
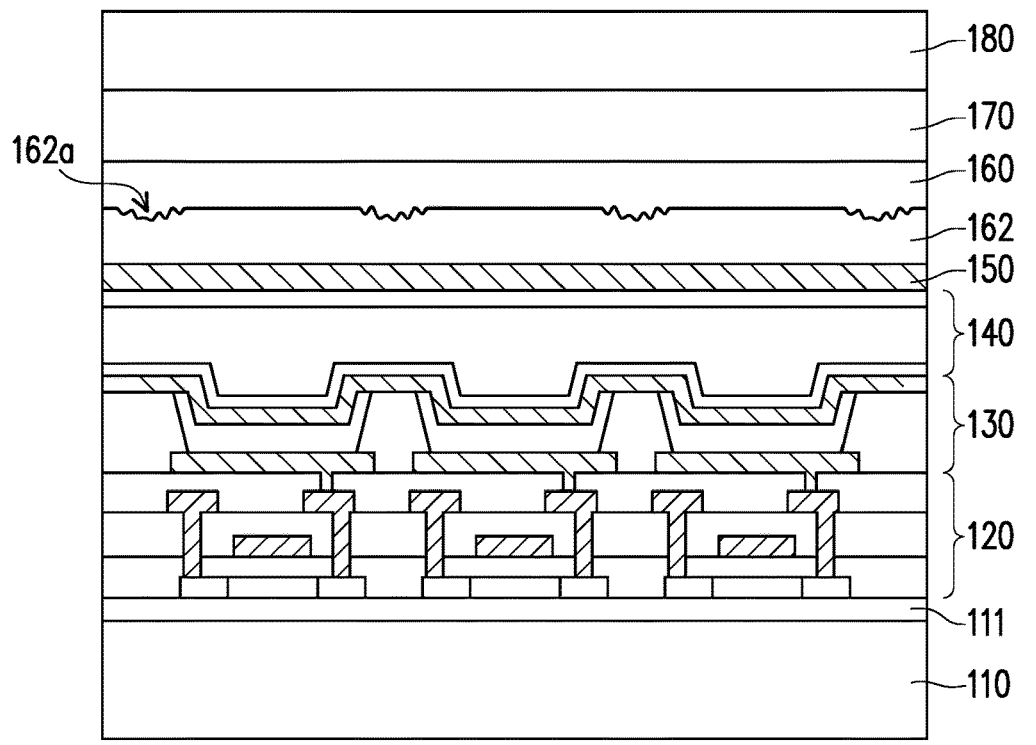

FIG. 8A and FIG. 8B are schematic partial cross-sectional views of a display device according to some embodiments of the disclosure. Referring to FIG. 1 and FIG. 8A (or FIG. 8B) at the same time, a display device 100b (or a display device 100c) of this embodiment is substantially similar to the display device 100 of FIG. 1, so the same and similar components in the two embodiments will not be repeatedly described herein. The main difference between the display device 100b (or the display device 100c) of this embodiment and the display device 100 lies in that the display device 100b (or the display device 100c) further includes an insulating layer 161 (or an insulating layer 162).

Specifically, referring to FIG. 8A, the insulating layer 161 is disposed between the insulating layer 160 and the touch sensing unit 150. The insulating layer 161 has a plurality of recesses 161a, and the recesses 161a do not penetrate the insulating layer 161. The recess 161a may be disposed corresponding to the non-light-emitting region 101, but is not disposed corresponding to the light-emitting regions 102R, 102G, and 102B, so that the recess 161a can scatter external light to improve the anti-reflection effect.

In addition, in other embodiments, other morphology designs may also be adopted to replace the recess to achieve the anti-reflection effect. As shown in FIG. 8B, the insulating layer 162 of the display device 100c is disposed between the insulating layer 160 and the touch sensing unit 150 and has a plurality of rough surfaces 162a. The rough surface 162a may be disposed corresponding to the non-light-emitting region 101, but is not disposed corresponding to the light-emitting regions 102R, 102G, and 102B, so that the rough surface 162a can scatter external light to improve the anti-reflection effect.

FIG. 9 is a schematic top view of a display device according to another embodiment of the disclosure. FIG. 10A to FIG. 10E are cross-sectional views showing a process of a method for manufacturing the display device of FIG. 9 taken along section line A-A'. FIG. 11A to FIG. 11C are cross-sectional views showing a process of a method for manufacturing the display device of FIG. 9 taken along section line B-B'. For clarity of the drawings and convenience of illustration, FIG. 9 omits several components in a display device 100d. In addition, the anti-reflection layer 170 and/or the cover layer 180 of island regions 103, 103a, and 103b in the display device 100d may be designed according to any of the above embodiments. The description below is based on a design similar to that shown in FIG. 3H, but the disclosure is not limited thereto.

Referring to FIG. 9, the display device 100d includes a plurality of island regions 103, 103a, and 103b, a plurality of bridge regions 104, and a plurality of opening regions 105. The island regions 103, 103a, and 103b are separate from each other and each includes a plurality of light-emitting units 130. The bridge regions 104 are respectively disposed between two adjacent island regions (e.g., between the island region 103 and the island region 103a, or between the island region 103a and the island region 103b), and are configured to connect two adjacent island regions (e.g., the island region 103 and the island region 103a, or the island region 103a and the island region 103b). The opening regions 105 have holes 190 which penetrate the display device 100d. The opening regions 105 are respectively disposed between two adjacent island regions (e.g., between the island region 103 and the island region 103b) to isolate two adjacent island regions (e.g., the island region 103 and the island region 103b) by the hole 190. In this embodiment, with the design of the bridge regions 104 and the opening regions 105, the island regions 103, 103a, and 103b can be separate from each other, and the display device 100d of this embodiment can be stretchable. The stretchable display device 100d may be fit on an irregular surface (e.g., a spherical surface, a curved surface, an undulating surface, etc.) or may be stretched and enlarged for use. The expression "stretchable" mentioned in this disclosure may mean, for example, that the size of the display device may be stretched from 5 inches to 6 inches, or the distance between the island region 103 and the island region 103a or between the island region 103a and the island region 103b of the display device may be changed by any operation, but the disclosure is not limited thereto.

Next, since the embodiment shown in FIG. 10A to FIG. 10E is similar to the embodiment shown in FIG. 3A to FIG. 3H, the same materials or methods may apply to the same or similar components and the same and similar descriptions in the two embodiments will not be repeated herein. The difference between the embodiment shown in FIG. 10A to FIG. 10E and the embodiment shown in FIG. 3A to FIG. 3H lies in that the method for manufacturing the display device 100d of this embodiment further includes forming the bridge region 104 between the island region 103 and the island region 103a adjacent to each other.

Specifically, referring to FIG. 10A and FIG. 10B first, sequentially, a pixel circuit 120 is formed on the substrate 110, a light-emitting unit 130 is formed on the pixel circuit 120, an encapsulation layer 140 is formed on the light-emitting unit 130, and a touch sensing unit 150 is formed on the light-emitting unit 130. A transistor 121 in the pixel circuit 120 and the light-emitting unit 130 are both disposed in the island regions 103 and 103a, but are not disposed in the bridge region 104. In the bridge region 104, a metal layer GE1 may be disposed on a gate insulating layer GI, and a metal layer SD3 may be disposed on an insulating layer 122. The light-emitting unit 130 includes a red light-emitting diode 133R, a green light-emitting diode 133G, and a blue light-emitting diode 133B. The touch sensing unit 150 is disposed on the encapsulation layer 140 in the island regions 103 and 103a and the bridge region 104, so that the touch sensing unit 150 in the island regions 103 and 103a and the touch sensing unit 150 in the bridge region 104 may be located on the same horizontal plane and may be easier to manufacture.

Figure 10C:
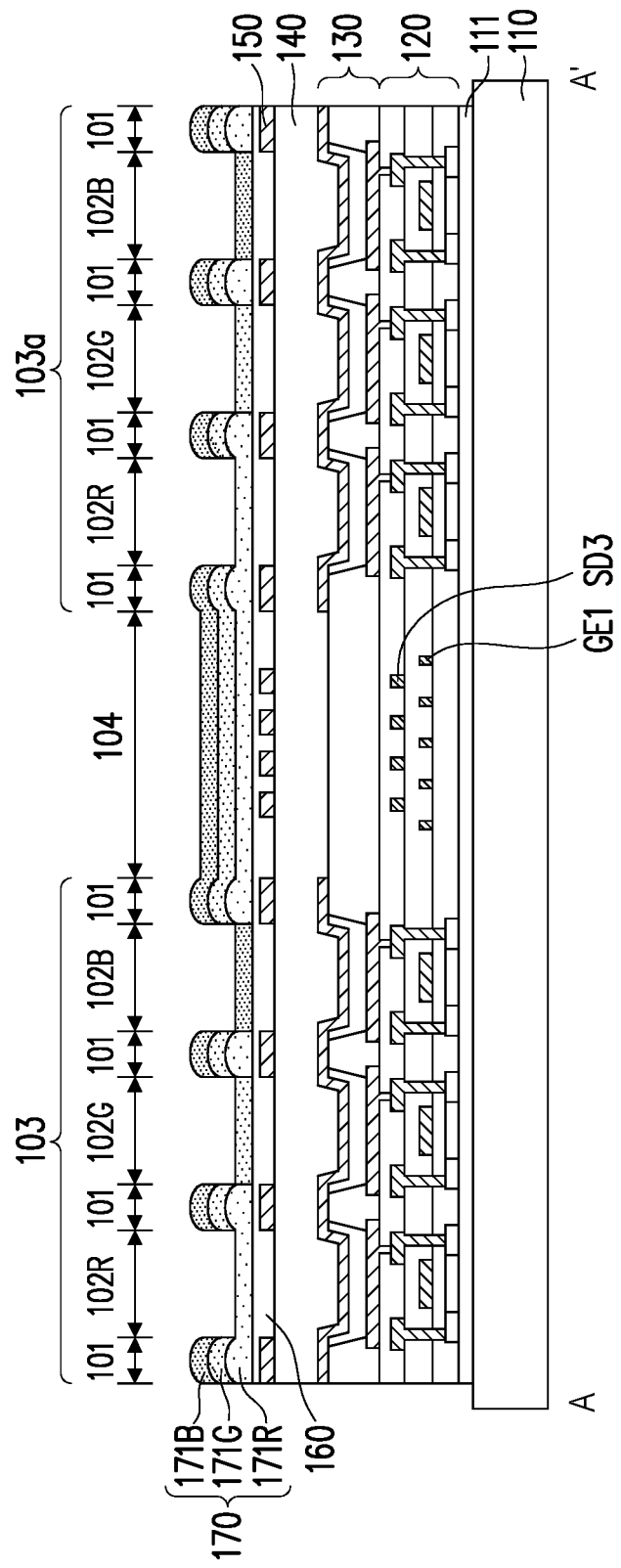
Figure 11A:
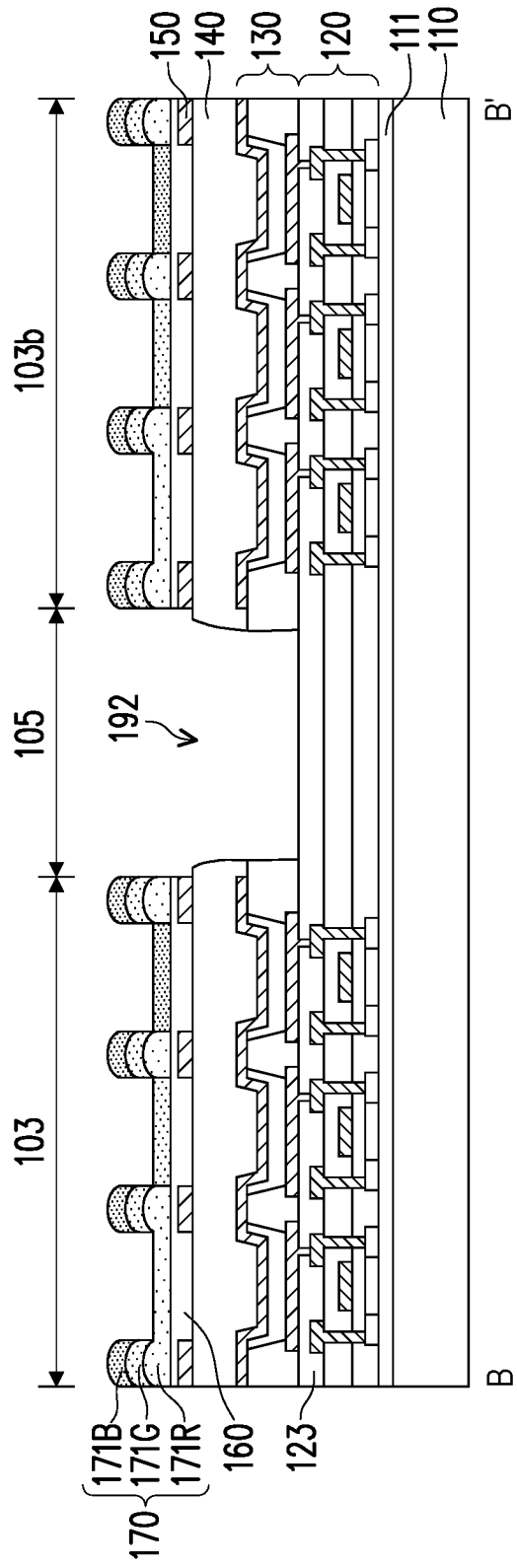
FIG. 11A to FIG. 11C are cross-sectional views showing a process of a method for manufacturing the display device of FIG. 9 taken along section line B-B'.
Figure 11B:
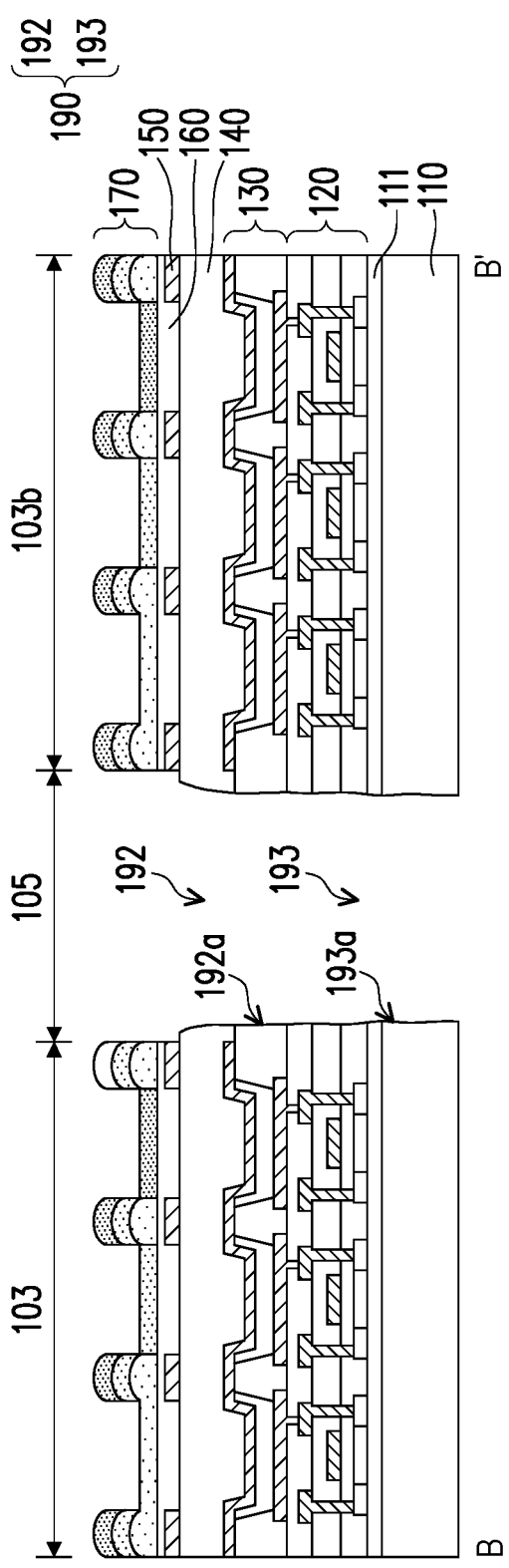
Figure 11C:
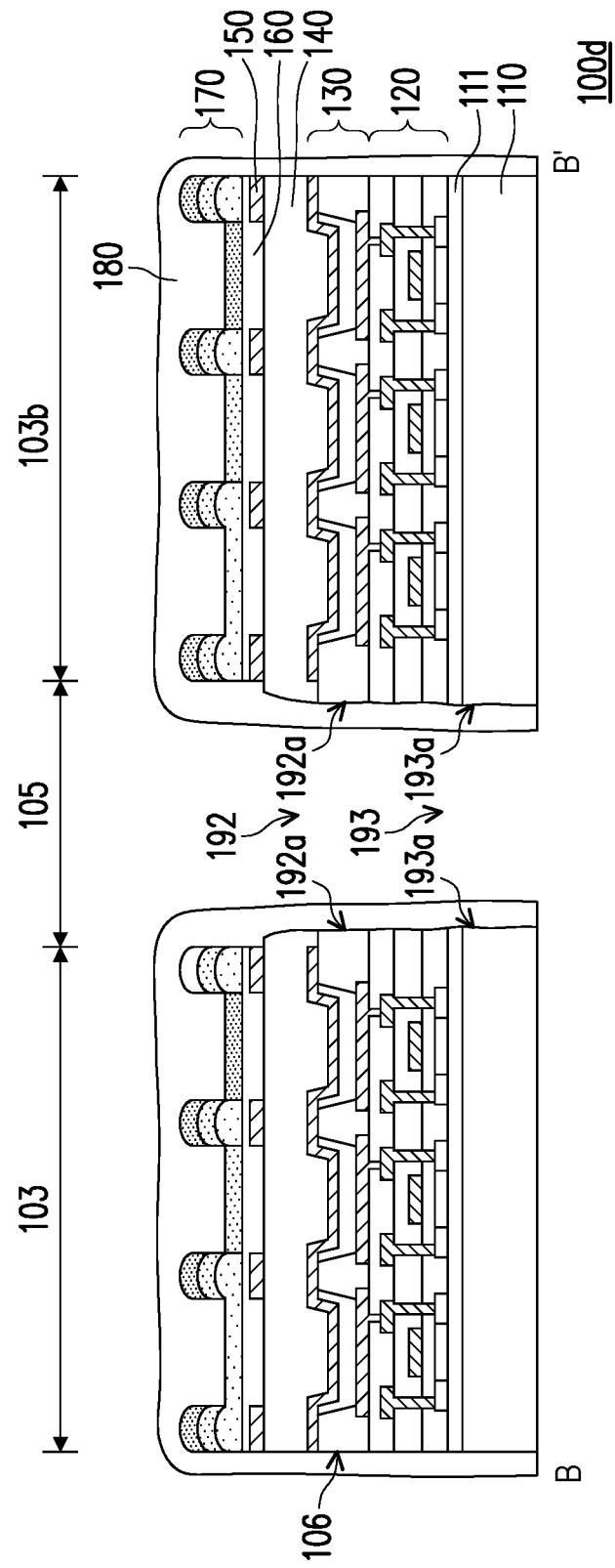

Next, referring to FIG. 10C, an anti-reflection layer 170 is formed on the insulating layer 160, and the anti-reflection layer 170 includes a red color filter layer 171R, a green color filter layer 171G, and a blue color filter layer 171B. Specifically, the red color filter layer 171R is disposed on the insulating layer 160 and is disposed corresponding to the light-emitting region 102R (i.e., the light-emitting region of the red light-emitting diode 133R) and the non-light-emitting region 101 in the island regions 103 and 103a and the bridge region 104. The green color filter layer 171G is disposed on the insulating layer 160 and the color filter layer 171R and is disposed corresponding to the light-emitting region 102G and the non-light-emitting region 101 in the island regions 103 and 103a and the bridge region 104. The blue color filter layer 171B is disposed on the insulating layer 160 and the color filter layer 171G and is disposed corresponding to the light-emitting region 102B and the non-light-emitting region 101 in the island regions 103 and 103a and the bridge region 104.

Figure 10D:
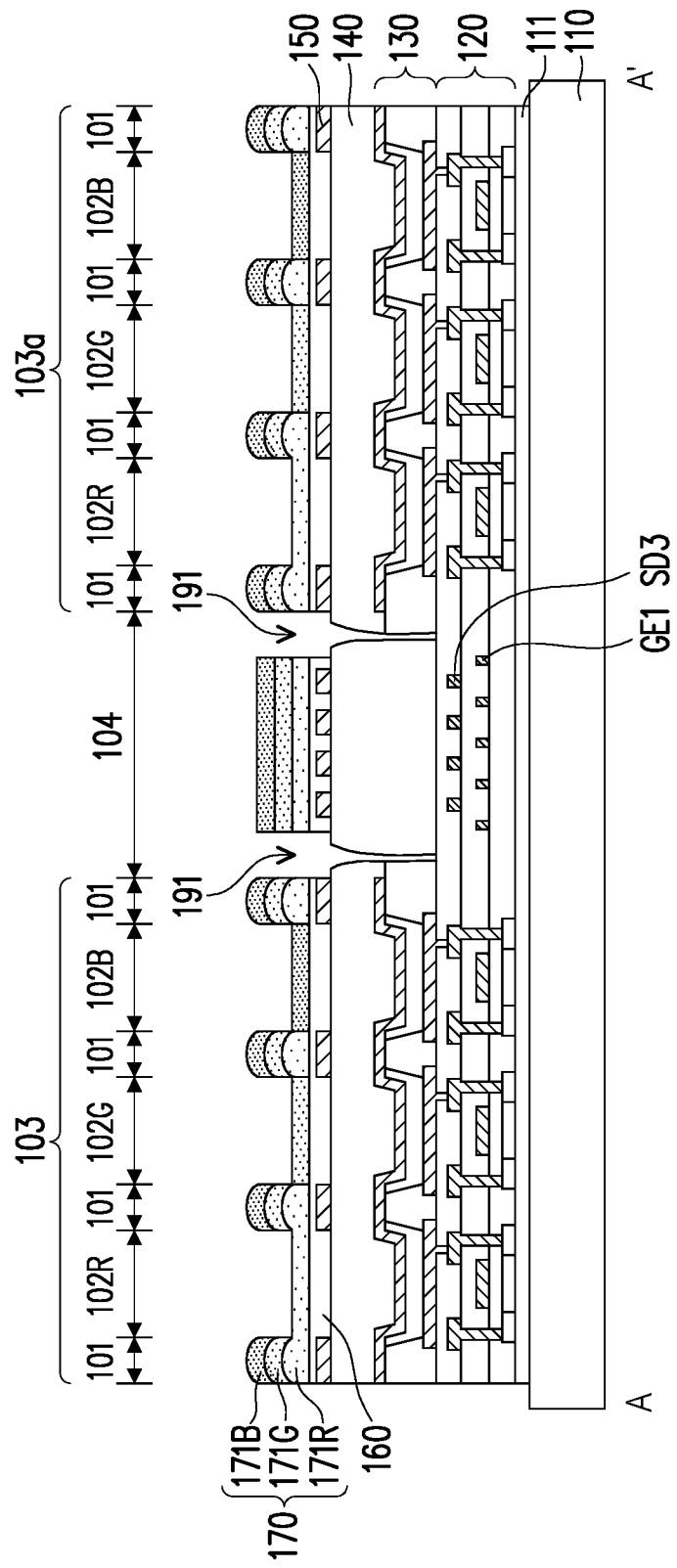
Figure 10E:
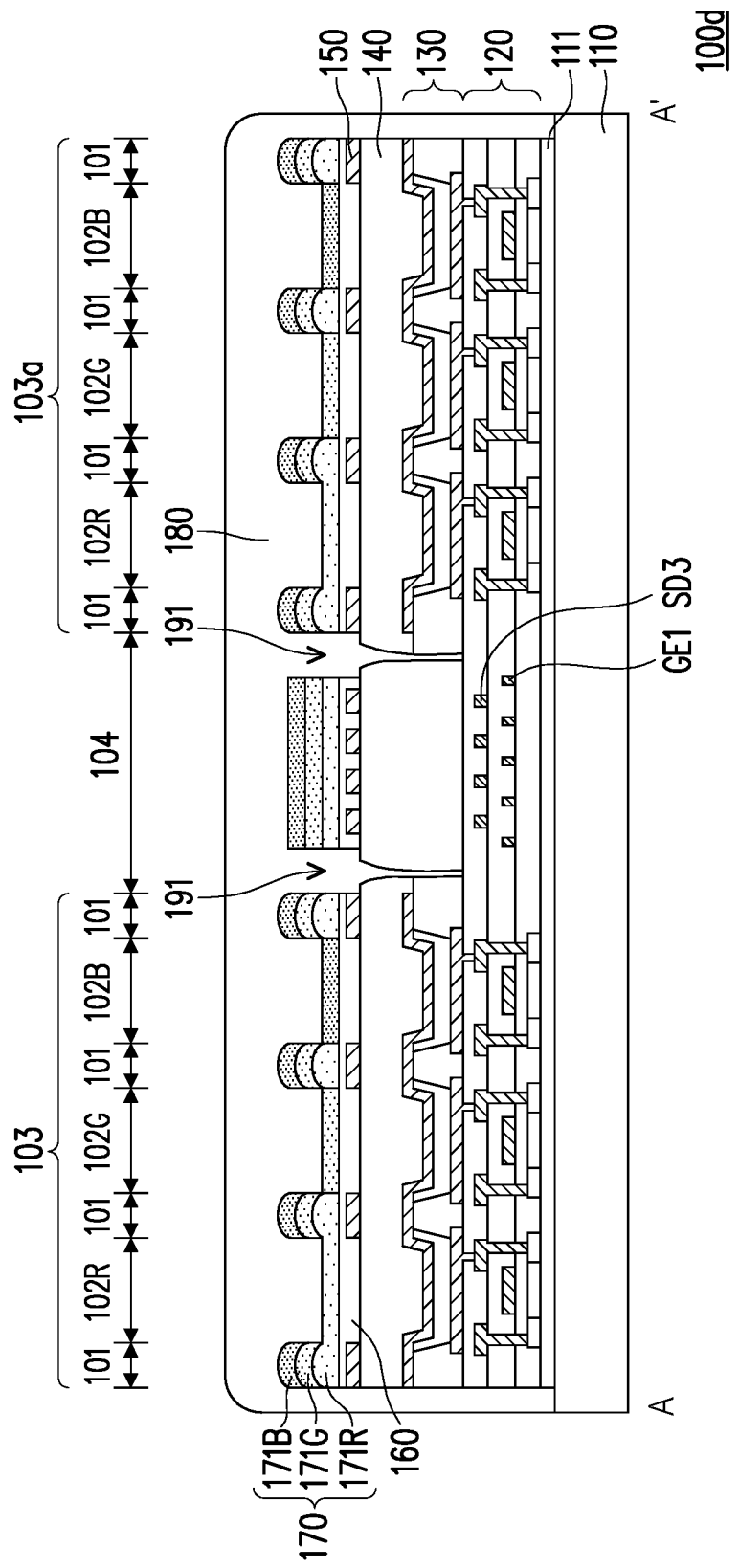

Then, referring to FIG. 10D and FIG. 10E, a groove 191 is formed at the junction between the island regions 103 and 103a and the bridge region 104, and a cover layer 180 is formed on the anti-reflection layer 170 and in the groove 191. In this embodiment, the groove 191 may be formed by, for example, etching, laser drilling, or a combination of the above but is not limited thereto. The groove 191 may expose part of the insulating layer 123 in the pixel circuit 120, and the groove 191 does not penetrate the substrate 110, so stress can be released accordingly. The cover layer 180 may cover the anti-reflection layer 170 and a sidewall 106 of the display device 100d. So far, the island regions 103 and 103a and the bridge region 104 in the display device 100d of this embodiment have been completed.

In addition, since the embodiment shown in FIG. 11A to FIG. 11C is similar to the embodiment shown in FIG. 3A to FIG. 3H, the same materials or methods may apply to the same or similar components and the same and similar descriptions in the two embodiments will not be repeated herein. The difference between the embodiment shown in FIG. 11A to FIG. 11C and the embodiment shown in FIG. 3A to FIG. 3H lies in that the method for manufacturing the display device 100d of this embodiment further includes forming an opening region 105 between the island region 103 and the island region 103b adjacent to each other.

Specifically, FIG. 11A to FIG. 11C may be regarded as steps continuing FIG. 10C and replacing FIG. 10D to FIG. 10E, and the manufacturing continues with the island region 103b and the opening region 105 in FIG. 11A to FIG. 11C respectively replacing the island region 103a and the bridge region 104 in FIG. 10A to FIG. 10C. Referring to FIG. 11A first, the anti-reflection layer 170, the insulating layer 160, the touch sensing unit 150, the encapsulation layer 140, and the light-emitting unit 130 of the opening region 105 are etched and/or drilled to form a hole 192. The hole 192 may expose part of the insulating layer 123 in the pixel circuit 120.

Next, referring to FIG. 11B, the pixel circuit 120 and the substrate 110 of the opening region 105 are etched and/or drilled to form a hole 193. The hole 192 is connected to the hole 193 to form a hole 190 penetrating the display device 100d. A sidewall 192a of the hole 192 and a sidewall 193a of the hole 193 may be rough surfaces. It is possible that the sidewall 192a of the hole 192 and the sidewall 193a of the hole 193 are not flush with each other. In addition, although the hole 192 and the hole 193 in this embodiment are formed in two steps, in some embodiments, the hole 192 and the hole 193 may also be formed simultaneously in one step. In this embodiment, the hole 192 and the hole 193 may be formed by, for example, etching, laser drilling, or a combination of the above but are not limited thereto.

Then, referring to FIG. 11C, a cover layer 180 is formed on the anti-reflection layer 170, in the hole 192, and in the hole 193. The cover layer 180 may cover the anti-reflection layer 170, the sidewall 106 of the display device 100d, the sidewall 192a of the hole 192, and the sidewall 193a of the hole 193. So far, the island regions 103 and 103b and the opening region 105 in the display device 100d of this embodiment have been completed.

Figure 12C:
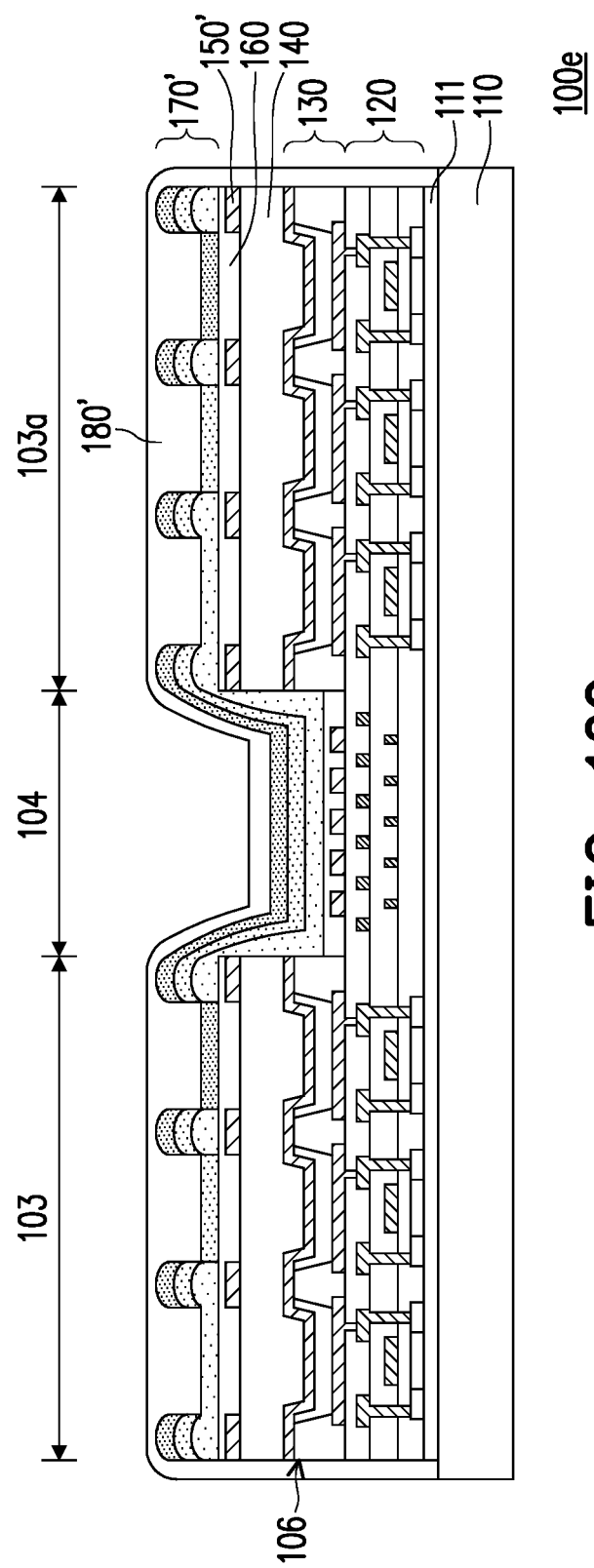

FIG. 12A to FIG. 12C are cross-sectional views showing a process of a method for manufacturing the display device of FIG. 9 taken along section line A-A' according to another embodiment. Since the embodiment shown in FIG. 12A to FIG. 12C is similar to the embodiment shown in FIG. 10A to FIG. 10E, the same materials or methods may apply to the same or similar components and the same and similar descriptions in the two embodiments will not be repeated herein. The difference between the embodiment shown in FIG. 12A to FIG. 12C and the embodiment shown in FIG. 10A to FIG. 10E lies in that, in the method for manufacturing the bridge region 104 of a display device 100e of this embodiment, first, a hole 191' is formed in the bridge region 104, and then a touch sensing unit 150' and an anti-reflection layer 170' are formed in the island regions 103 and 103a and the bridge region 104.

Specifically, referring to FIG. 12A which shows a step continuing FIG. 10A, the hole 191' is formed in the bridge region 104 so that the hole 191' can expose part of the insulating layer 123 in the pixel circuit 120. Then, referring to FIG. 12B, the touch sensing unit 150' is formed on the encapsulation layer 140 in the island regions 103 and 103a and in the hole 191' in the bridge region 104. Since the touch sensing unit 150' in the bridge region 104 is disposed on the insulating layer 123 in the hole 191', the touch sensing unit 150' in the bridge region 104 may be closer to the pixel circuit 120 and the light-emitting unit 130, so that the stress of the bridge region 104 can be more concentrated and easier to adjust or the bridge region 104 may have a better stretching effect. Then, referring to FIG. 12C, the anti-reflection layer 170' is formed on the insulating layer 160, and a cover layer 180' is formed on the anti-reflection layer 170'. The anti-reflection layer 170' may be disposed on the insulating layer 160 in the island regions 103 and 103a and on the insulating layer 160 in the hole 191' in the bridge region 104. The cover layer 180' may be disposed on the anti-reflection layer 170' in the island regions 103 and 103a and on the anti-reflection layer 170' in the hole 191' in the bridge region 104. So far, the island regions 103 and 103a and the bridge region 104 in the display device 100e of this embodiment have been completed.

In addition, the opening region of the display device 100e in this embodiment may also be manufactured by a method different from that in FIG. 11A to FIG. 11C. The main difference between the method for manufacturing the opening region of this embodiment and the manufacturing method of FIG. 11A to FIG. 11C lies in that, in the method for manufacturing the opening region of the display device 100e of this embodiment, first, a hole which exposes part of the insulating layer 123 in the pixel circuit 120 is formed in the opening region, which is similar to the step shown in FIG. 12A (when the bridge region 104 in FIG. 12A is regarded as the opening region, and the island region 103a is regarded as the island region 103b). Next, a touch sensing unit 150' and an anti-reflection layer 170' are formed in the island regions 103 and 103b, which similar to the step shown in FIG. 11A. Then, a hole penetrating the display device 100e is formed in the opening region, which is similar to the step shown in FIG. 11B. Then, a cover layer 180 is formed on the anti-reflection layer 170', which is similar to the step shown in FIG. 11C. So far, the island regions 103, 103b and the opening region in the display device 100e of this embodiment have been completed.

Figure 13:
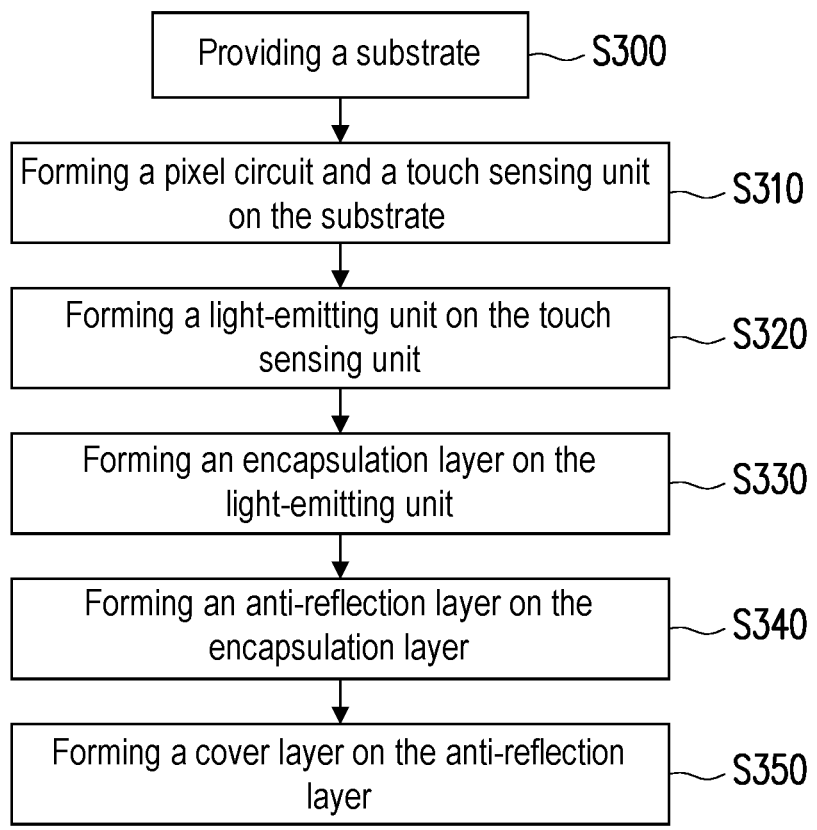
FIG. 13 is a flowchart of a method for manufacturing a display device according to another embodiment of the disclosure.

FIG. 13 is a flowchart of a method for manufacturing a display device according to another embodiment of the disclosure. FIG. 14A to FIG. 14D are cross-sectional views showing a process of a method for manufacturing a display device according to another embodiment of the disclosure. Since the embodiment shown in FIG. 2 (or FIG. 3A to FIG. 3H) is similar to the embodiment shown in FIG. 13 (or FIG. 14A to FIG. 14D), the same materials or methods may apply to the same or similar components and the same and similar descriptions in the two embodiments will not be repeated herein. The difference between the embodiment shown in FIG. 2 (or FIG. 3A to FIG. 3H) and the embodiment shown in FIG. 13 (or FIG. 14A to FIG. 14D) lies in that, in the method for manufacturing a display device 100f of this embodiment, a light-emitting element 133f is formed on the pixel circuit 120 by transfer and bonding.

Figure 14A:
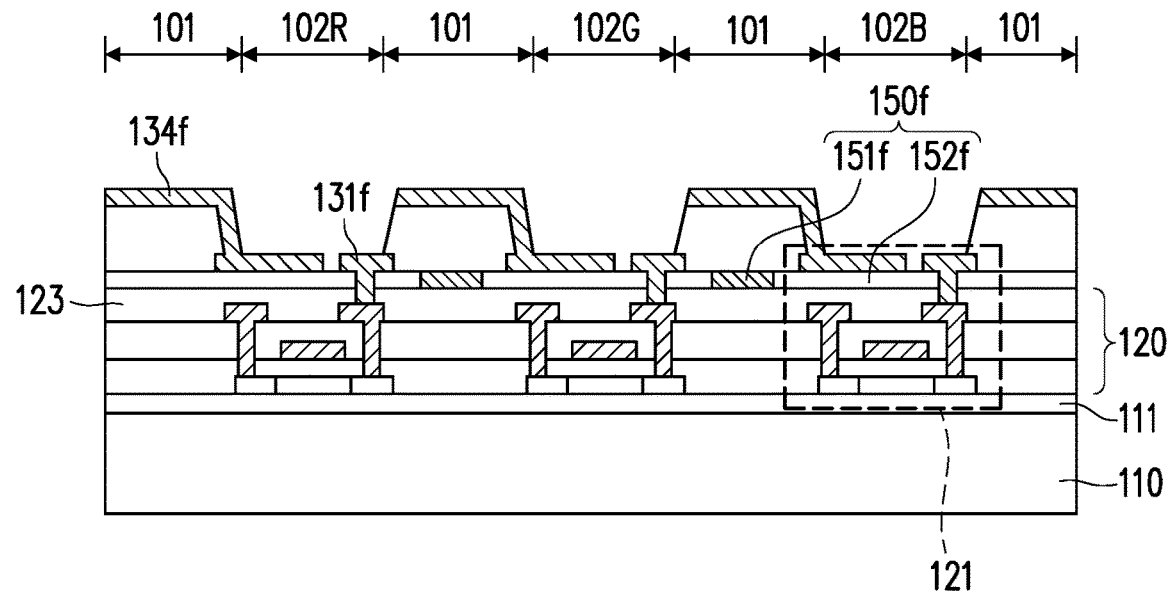
FIG. 14A to FIG. 14D are cross-sectional views showing a process of a method for manufacturing a display device according to another embodiment of the disclosure.

Specifically, referring to FIG. 13 and FIG. 14A at the same time, in the method for manufacturing the display device 100f of this embodiment, first, step S300 and step S310 are performed to provide a substrate 110 and form a pixel circuit 120 and a touch sensing unit 150f on the substrate 110. Specifically, a buffer layer 111 is further included between the pixel circuit 120 and the substrate 110. The touch sensing unit 150f may include a first metal layer 151f and an insulating layer 152f. The first metal layer 151f and the insulating layer 152f are adjacently disposed on the insulating layer 123 of the pixel circuit 120. The first metal layer 151f is disposed corresponding to the non-light-emitting region 101, but is not disposed corresponding to the light-emitting regions 102R, 102G, and 102B.

Figure 14B:
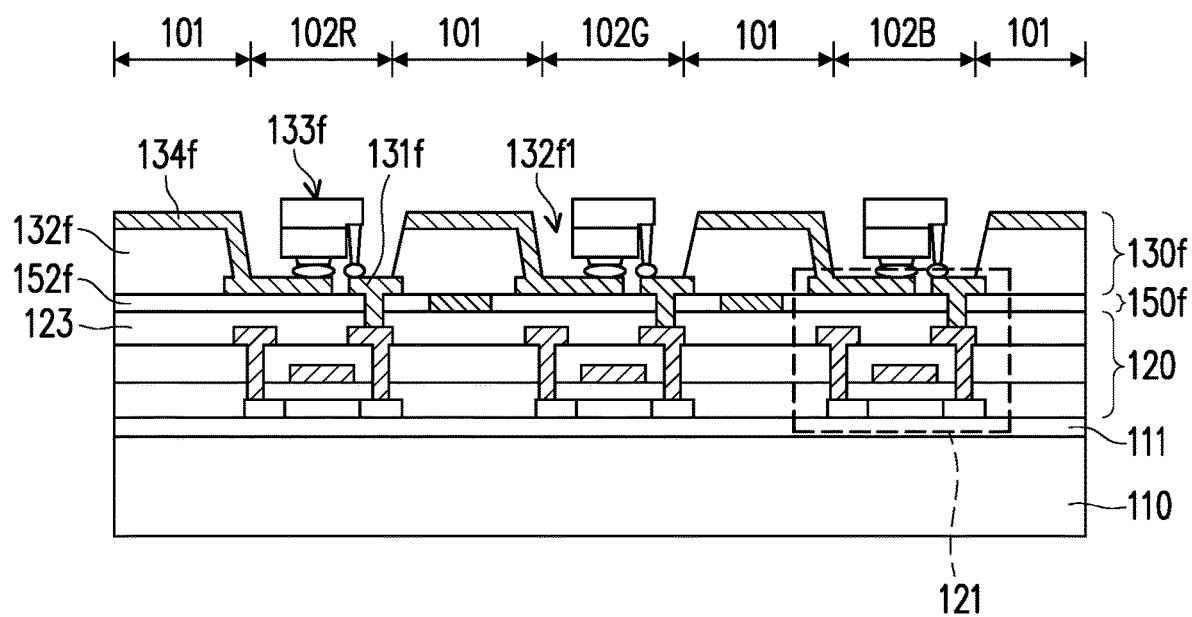

Next, referring to FIG. 13, FIG. 14A, and FIG. 14B, step S320 is performed to form a light-emitting unit 130f on the touch sensing unit 150f. Specifically, the light-emitting unit 130f includes a first electrode 131f, an insulating layer 132f, a light-emitting element 133f, and a second electrode 134f. The first electrode 131f and the second electrode 134f are adjacently disposed on the insulating layer 152f. The insulating layer 132f is disposed on the first electrode 131f and the second electrode 134f. The insulating layer 132f has an opening 132f1 to expose part of the first electrode 131f and part of the second electrode 134f. The light-emitting element 133f which has been completed is transferred into the opening 132f1 to bond to the first electrode 131f and the second electrode 134f in the opening 132f1 and electrically connect to the transistor 121 via the first electrode 131f. In this embodiment, the light-emitting element 133f may be, for example, a flip-chip micro light-emitting diode but is not limited thereto. The light-emitting element 133f may include a red light-emitting diode, a green light-emitting diode, and a blue light-emitting diode but is not limited thereto. In some embodiments, the light-emitting element 133f may also be a blue light-emitting diode.

Figure 14C:
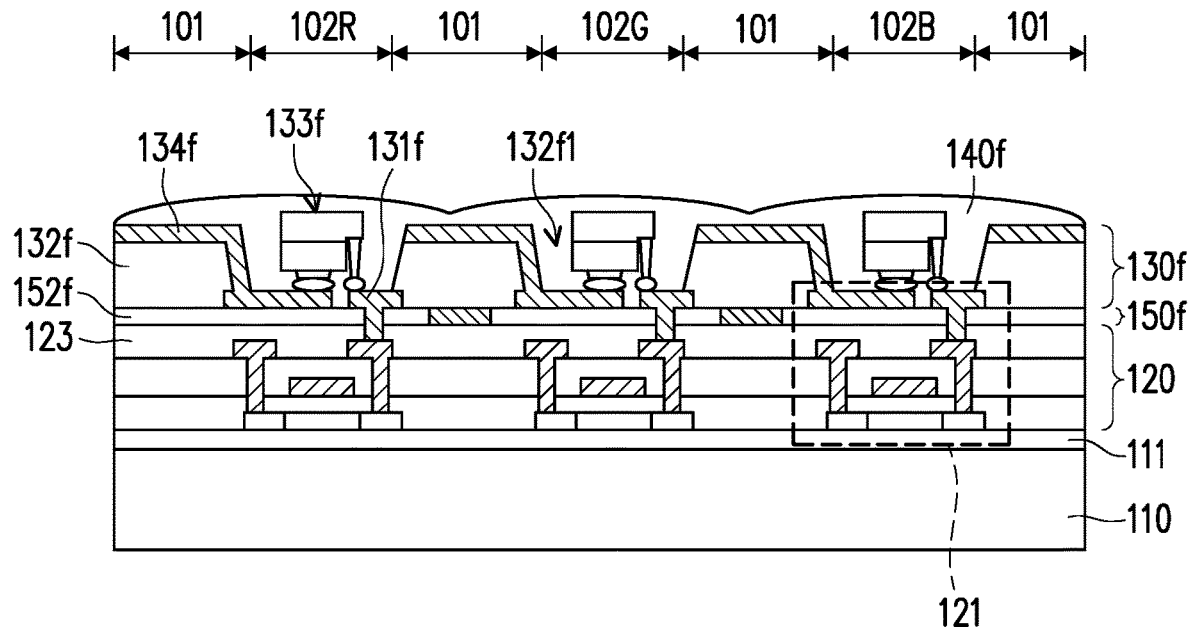
Figure 14D:
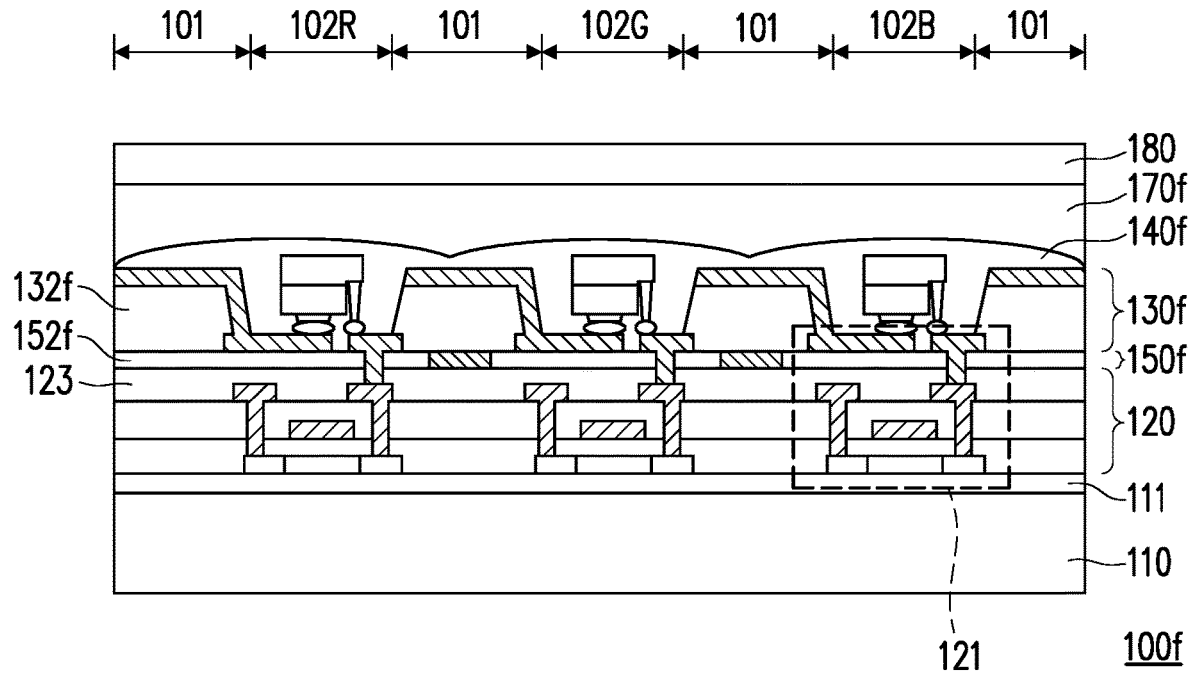

Then, referring to FIG. 13, FIG. 14C, and FIG. 14D, step S330, step S340, and step S350 are performed to form an encapsulation layer 140f on the light-emitting unit 130f, form an anti-reflection layer 170f on the encapsulation layer 140f, and form a cover layer 180 on the anti-reflection layer 170f. The encapsulation layer 140f may be disposed in the opening 132f1 and may cover the light-emitting element 133f and the second electrode 134f. The anti-reflection layer 170f may include a color filter layer, a polarizer, or a wire-grid polarizer. So far, the display device 100f of this embodiment has been completed.

Figure 15:
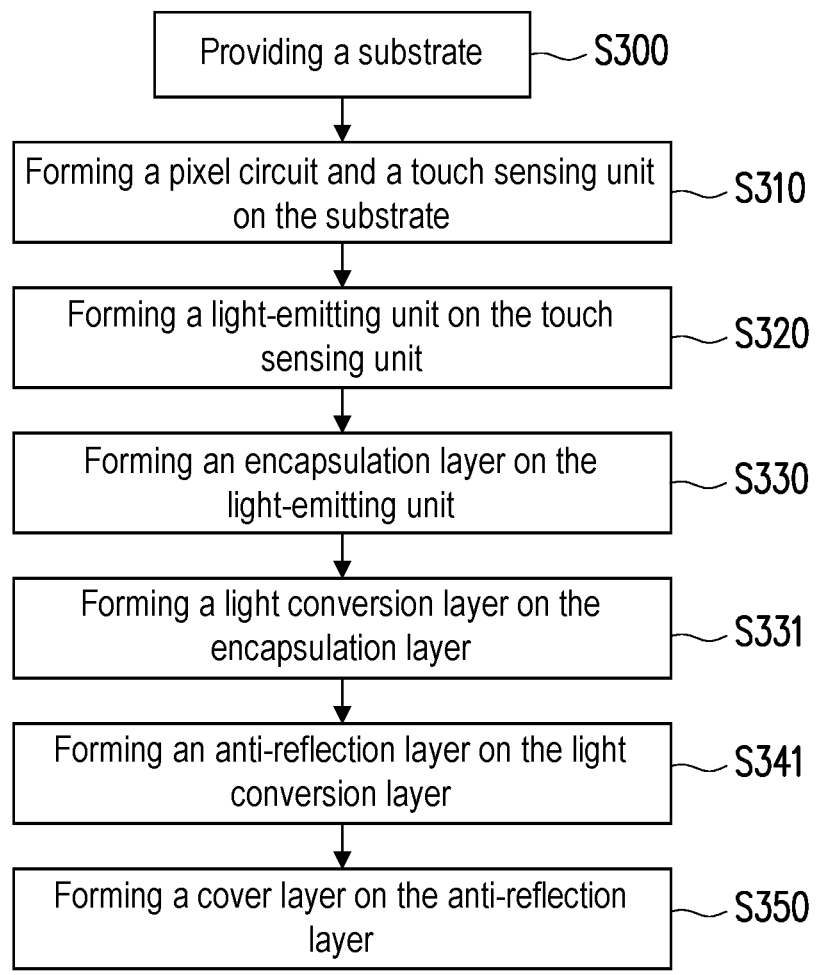
FIG. 15 is a flowchart of a method for manufacturing a display device according to another embodiment of the disclosure.

FIG. 15 is a flowchart of a method for manufacturing a display device according to another embodiment of the disclosure. FIG. 16A to FIG. 16D are cross-sectional views showing a process of a method for manufacturing a display device according to another embodiment of the disclosure. Since the embodiment shown in FIG. 13 (or FIG. 14A to FIG. 14D) is similar to the embodiment shown in FIG. 15 (or FIG. 16A to FIG. 16D), the same materials or methods may apply to the same or similar components and the same and similar descriptions in the two embodiments will not be repeated herein. The difference between the embodiment shown in FIG. 13 (or FIG. 14A to FIG. 14D) and the embodiment shown in FIG. 15 (or FIG. 16A to FIG. 16D) lies in that, the method for manufacturing a display device 100g of this embodiment further includes forming a light conversion layer 200 on an encapsulation layer 140g.

Figure 16A:
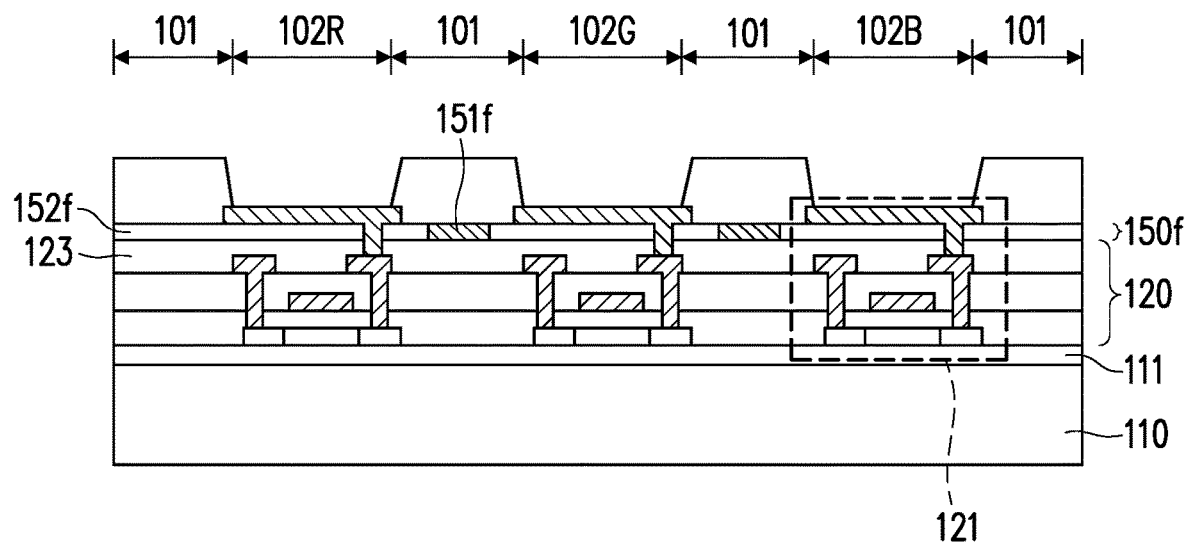
FIG. 16A to FIG. 16D are cross-sectional views showing a process of a method for manufacturing a display device according to another embodiment of the disclosure.

Specifically, referring to FIG. 15 and FIG. 16A at the same time, in the method for manufacturing the display device 100g of this embodiment, first, steps S300 and S310 are performed to provide a substrate 110 and form a pixel circuit 120 and a touch sensing unit 150f on the substrate 110. Specifically, a buffer layer 111 is further included between the pixel circuit 120 and the substrate 110. The touch sensing unit 150f may include a first metal layer 151f and an insulating layer 152f. The first metal layer 151f and the insulating layer 152f are adjacently disposed on an insulating layer 123 of the pixel circuit 120. The first metal layer 151f is disposed corresponding to the non-light-emitting region 101 but is not disposed corresponding to the light-emitting regions 102R, 102G, and 102B.

Figure 16B:
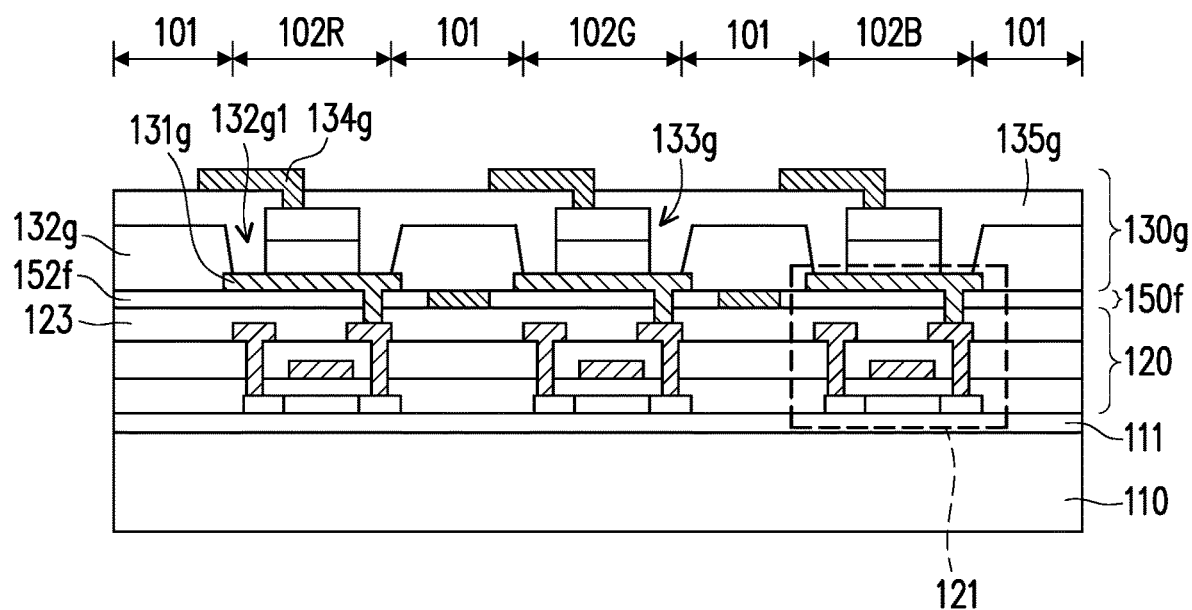

Next, referring to FIG. 15, FIG. 16A, and FIG. 16B, step S320 is performed to form a light-emitting unit 130g on the touch sensing unit 150f. Specifically, the light-emitting unit 130g includes a first electrode 131g, an insulating layer 132g, a light-emitting element 133g, a second electrode 134g, and an insulating layer 135g. The first electrode 131g is disposed on the insulating layer 152f. The insulating layer 132g is disposed on the first electrode 131g. The insulating layer 132g has an opening 132g1 to expose part of the first electrode 131g. The light-emitting element 133g which has been completed is transferred into the opening 132g1 to bond to the first electrode 131g in the opening 132g1 and electrically connect to the transistor 121 via the first electrode 131g. The insulating layer 135g is disposed on the insulating layer 132g and in the opening 132g1 to cover the light-emitting element 133g. The second electrode 134g is disposed on the insulating layer 135g and is electrically connected to the light-emitting element 133g. In this embodiment, the light-emitting element 133g may be, for example, a vertical micro light-emitting diode or a vertical nano light-emitting diode (nano-LED) but is not limited thereto. The light-emitting element 133g may include a blue light-emitting diode but is not limited thereto.

Figure 16C:
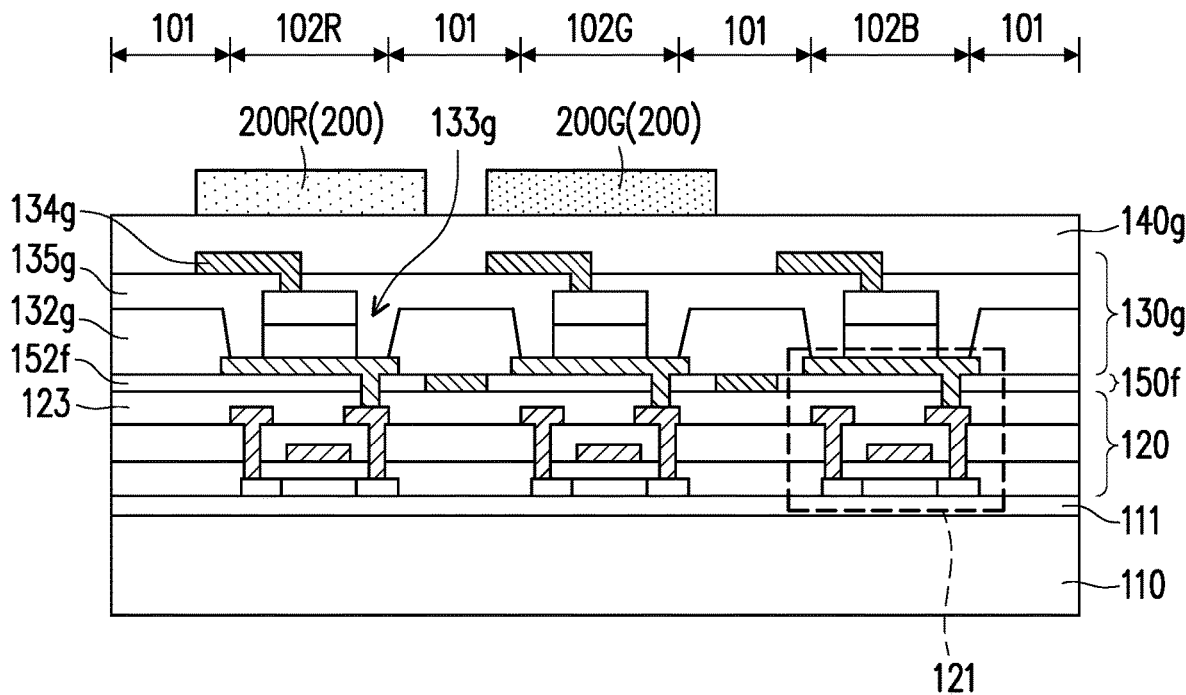

Then, referring to FIG. 15 and FIG. 16C, step S330 and step S331 are performed to form an encapsulation layer 140g on the light-emitting unit 130g and form a light conversion layer 200 on the encapsulation layer 140g. The encapsulation layer 140g may cover the insulating layer 135g and the second electrode 134g. The light conversion layer 200 may include a red light conversion layer 200R and a green light conversion layer 200G respectively disposed corresponding to one of the light-emitting elements 133g. In this embodiment, the light conversion layer 200 may include, for example, quantum dots but is not limited thereto.

Figure 16D:
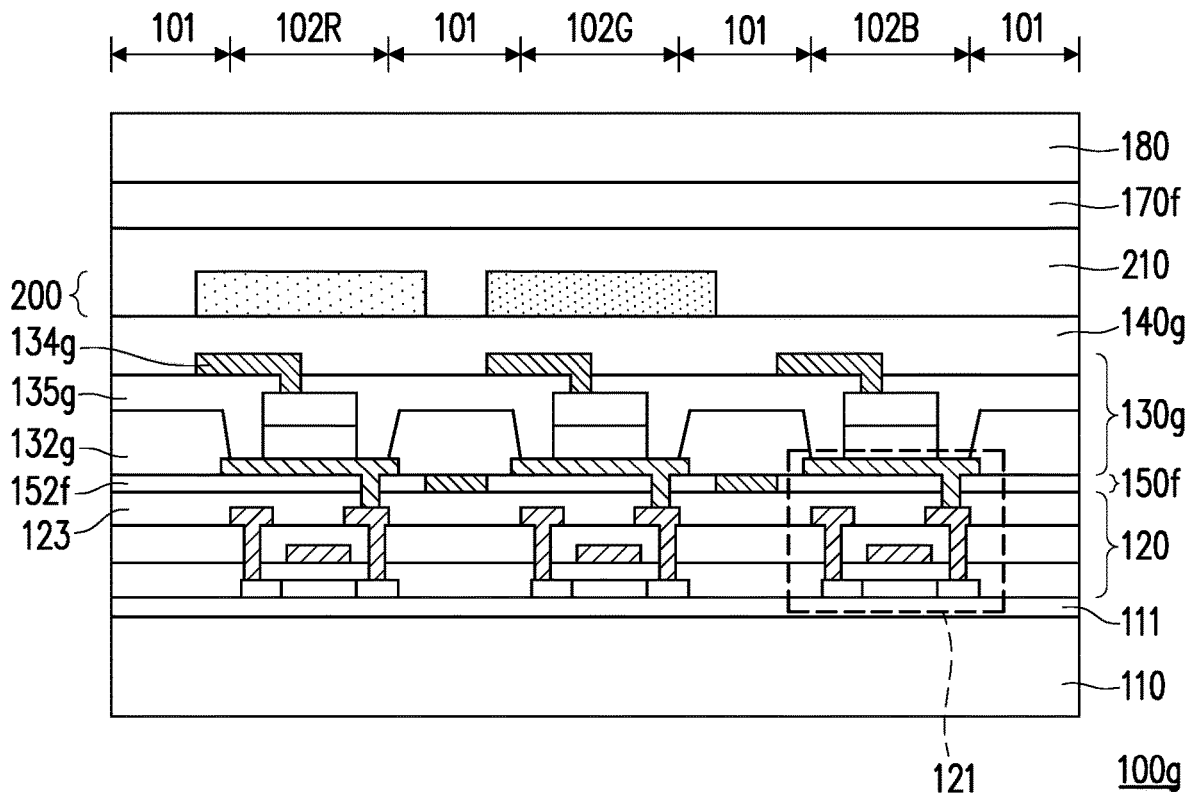

Then, referring to FIG. 15 and FIG. 16D, step S341 and step S350 are performed to form an anti-reflection layer 170f on the light conversion layer 200 and form a cover layer 180 on the anti-reflection layer 170f. Before the anti-reflection layer 170f is formed on the light conversion layer 200, an insulating layer 210 may be further formed on the light conversion layer 200, so that the insulating layer 210 can cover the light conversion layer 200 and the insulating layer 135g. The anti-reflection layer 170f may include a color filter layer, a polarizer, or a wire-grid polarizer. So far, the display device 100g of this embodiment has been completed.

In summary of the above, in the method for manufacturing the display device of the embodiments of the disclosure, compared to a method of attaching an anti-reflection layer externally onto the insulating layer, the method of forming the anti-reflection layer on the insulating layer in the embodiments of the disclosure can reduce the overall thickness, reduce the bending stress, improve the reliability, or increase the service life. For example, when the display device is a foldable display device or a stretchable display device, and when the display device is to be bent, rolled, or stretched, compared to the method of attaching an anti-reflection layer externally onto the insulating layer, the method of forming the anti-reflection layer on the insulating layer in the embodiments of the disclosure can reduce the bending stress to suppress separation of the anti-reflection layer, which thereby improves the reliability of the display device or increases the service life of the display device.

Finally, it should be noted that the foregoing embodiments are merely used for describing the technical solutions of the disclosure, but are not intended to limit the disclosure. Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

What is claimed is:

1. A method for manufacturing a display device, comprising:
providing a substrate;
forming a pixel circuit on the substrate;
forming a light-emitting unit on the pixel circuit;
forming a touch sensing unit on the light-emitting unit; and
forming an anti-reflection layer on the touch sensing unit,
wherein a portion of the anti-reflection layer comprises a stack having at least two of a red color filter layer, a green color filter layer and a blue color filter layer, and the stack is disposed on the touch sensing unit by a coating process, a photolithography process or an ink-jet printing process,
wherein the touch sensing unit is disposed between the anti-reflection layer and the substrate,
wherein in a cross-section view, a top surface of the anti-reflection layer has a first portion corresponding to the blue color filter layer, a second portion corresponding to the red color filter layer and a third portion corresponding to the green color filter layer, and a projection length of the first portion on the substrate is greater than a projection length of the second portion on the substrate or a projection length of third portion on the substrate.

2. The method as claimed in claim 1, wherein the anti-reflection layer is formed directly on an insulating layer.

3. The method as claimed in claim 1, further comprising:
forming a hole penetrating the display device.

4. The method as claimed in claim 1, wherein the display device is stretchable.

5. The method as claimed in claim 1, wherein the substrate has a light-emitting region and a non-light-emitting region, and the light-emitting unit comprises a light-emitting element,
wherein the light-emitting element overlaps with the light-emitting region, and the anti-reflective layer overlaps with the non-light-emitting region.

6. The method as claimed in claim 1, further comprising:
forming a plurality of holes penetrating the display device;
wherein the display device comprises:
a plurality of island regions comprising a plurality of light-emitting units;
a plurality of bridge regions respectively connected two adjacent island regions; and
a plurality of opening regions respectively disposed between two adjacent island regions and comprising the plurality of holes;
wherein the plurality of island regions are separated from each other by the plurality of holes.

7. The method as claimed in claim 1, wherein the display device comprises:
a plurality of island regions separated from each other and comprising a plurality of light-emitting units;
a plurality of bridge regions respectively connected two adjacent island regions; and
a plurality of opening regions respectively disposed between two adjacent island regions for isolating the plurality of island regions;
wherein the display device is stretchable when a distance between two adjacent island regions is changed.

* * * * *